(12) United States Patent
Long et al.

(10) Patent No.: US 11,562,697 B2
(45) Date of Patent: Jan. 24, 2023

(54) SHIFT REGISTER UNIT, SCANNING DRIVING CIRCUIT, DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yue Long, Beijing (CN); Benlian Wang, Beijing (CN); Yingsong Xu, Beijing (CN); Lili Du, Beijing (CN); Yao Huang, Beijing (CN); Yuanjie Xu, Beijing (CN); Tingliang Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/549,553

(22) Filed: Dec. 13, 2021

(65) Prior Publication Data
US 2022/0246101 A1 Aug. 4, 2022

(30) Foreign Application Priority Data
Feb. 1, 2021 (CN) .......................... 202110137391.1

(51) Int. Cl.
*G09G 3/3266* (2016.01)
*G09G 3/3225* (2016.01)
*G11C 19/28* (2006.01)

(52) U.S. Cl.
CPC ......... *G09G 3/3266* (2013.01); *G09G 3/3225* (2013.01); *G11C 19/28* (2013.01); *G09G 2300/0426* (2013.01); *G09G 2310/0286* (2013.01); *G09G 2310/08* (2013.01)

(58) Field of Classification Search
None
See application file for complete search history.

(56) References Cited

U.S. PATENT DOCUMENTS 11,100,856 B2 * 8/2021 Lee .................. G09G 3/3266
2018/0330667 A1 * 11/2018 Yuan ................ G09G 3/3266

* cited by examiner

*Primary Examiner* — Christopher J Kohlman
(74) *Attorney, Agent, or Firm* — Brooks Kushman P. C.

(57) ABSTRACT

A shift register unit, a scanning driving circuit, a display substrate and a display device. The shift register unit includes an output terminal, an output circuit and an output node control circuit. The output circuit is electrically coupled to a first output node, a second output node, a first voltage line, a second voltage line and the output terminal, respectively. The output node control circuit is electrically coupled to the first output node, the second output node, a third voltage line, a fourth voltage line, a fifth voltage line, a first clock signal line, a second clock signal line and an input terminal, respectively. At least one of a third voltage signal, a fourth voltage signal and a fifth voltage signal is different from a first voltage signal and ae second voltage signal.

19 Claims, 15 Drawing Sheets

SHIFT REGISTER UNIT, SCANNING DRIVING CIRCUIT, DISPLAY SUBSTRATE AND DISPLAY DEVICE

CROSS-REFERENCE TO RELATED APPLICATION

This application claims priority to Chinese Patent Application No. 202110137391.1 filed on Feb. 1, 2021, disclosure of which are incorporated herein by reference in its entirety.

TECHNICAL FIELD

The present application generally relates to the field of display technologies, and in particular to a shift register unit, a scanning driving circuit, a display substrate and a display device.

BACKGROUND

In an existing active matrix organic light-emitting diode (AMOLED) display device, a pixel compensation circuit is required to drive organic light-emitting devices. One common pixel compensation circuit requires a scanning driving circuit to provide a light-emitting control signal to the pixel compensation circuit. A shift register unit in the existing scanning driving circuit has problems of inaccurate output of light-emitting control signals due to reduction of transistors included in an output circuit that are electrically coupled to an output terminal and an excessive number of transistors connected to a first voltage line and/or a second voltage line.

SUMMARY

In a first aspect, one embodiment of the present disclosure provides a shift register unit, including: an output terminal, an output circuit and an output node control circuit. The output circuit is electrically coupled to a first output node, a second output node, a first voltage line, a second voltage line, and the output terminal, respectively, the output circuit is configured to, write a second voltage signal provided by the second voltage line into the output terminal under control of a potential of the first output node, and write a first voltage signal provided by the first voltage line into the output terminal under control of a potential of the second output node. The output node control circuit is electrically coupled to the first output node, the second output node, a third voltage line, a fourth voltage line, a fifth voltage line, a first clock signal line, a second clock signal line, and an input terminal, respectively; the output node control circuit is configured to control the potential of the first output node and the potential of the second output node, according to a third voltage signal provided by the third voltage line, a fourth voltage signal provided by the fourth voltage line, a fifth voltage signal provided by the fifth voltage line, a first clock signal provided by the first clock signal line, a second clock signal provided by the second clock signal line and an input signal provided by the input terminal. At least one of the third voltage signal, the fourth voltage signal and the fifth voltage signal is different from the first voltage signal and the second voltage signal.

Optionally, the output node control circuit includes a second node control sub-circuit, a third node control sub-circuit, a first output node control sub-circuit and a second output node control sub-circuit; the second node control sub-circuit is electrically coupled to the first clock signal line, the third voltage line, the first output node, and a second node, respectively; the second node control sub-circuit is configured to, write the third voltage signal into the second node under control of the first clock signal, and write the first clock signal into the second node under control of the potential of the first output node; the third node control sub-circuit is electrically coupled to a third node, the second node, and the second clock signal line, respectively; the third node control sub-circuit is configured to, write the second clock signal into the third node under control of a potential of the second node, and adjust a potential of the third node according to the potential of the second node; the second output node control sub-circuit is electrically coupled to the second clock signal line, the third node, the second output node, the fourth voltage line, and the first output node, respectively; the second output node control sub-circuit is configured to control communication between the third node and the second output node under control of the second clock signal, write the fourth voltage signal provided by the fourth voltage line into the second output node under control of the potential of the first output node, and maintain the potential of the second output node; the first output node control sub-circuit is electrically coupled to the first clock signal line, the input terminal, the second clock signal line, the fifth voltage line, the second node, and the first output node, respectively; the first output node control sub-circuit is configured to write the input signal provided by the input terminal into the first output node under control of the first clock signal, and write the fifth voltage signal into the first output node under control of the second clock signal and the potential of the second node.

Optionally, the fourth voltage line and the fifth voltage line are a first high voltage line; the third voltage line is a second low voltage line; the first voltage line is the first high voltage line; the second voltage line is a first low voltage line; and a first low voltage signal provided by the first low voltage line is different from a second low voltage signal provided by the second low voltage line.

Optionally, the third voltage line is a first low voltage line; the fourth voltage line and the fifth voltage line are a first high voltage line; the first voltage line is a second high voltage line; the second voltage line is the first low voltage line; and a first high voltage signal provided by the first high voltage line is different from a second high voltage signal provided by the second high voltage line.

Optionally, the third voltage line is a first low voltage line; the fourth voltage line is a first high voltage line; the fifth voltage line is a second high voltage line; the first voltage line is the first high voltage line; the second voltage line is the first low voltage line; and a first high voltage signal provided by the first high voltage line is different from a second high voltage signal provided by the second high voltage line.

Optionally, the third voltage line is a first low voltage line; the fourth voltage line is a second high voltage line; the fifth voltage line is a first high voltage line; the first voltage line is the first high voltage line; the second voltage line is the first low voltage line; and a first high voltage signal provided by the first high voltage line is different from a second high voltage signal provided by the second high voltage line.

Optionally, the third voltage line is a first low voltage line; the fourth voltage line and the fifth voltage line are a first high voltage line; the first voltage line is a second high voltage line; the second voltage line is a second low voltage line; a first low voltage signal provided by the first low voltage line is different from a second low voltage signal provided by the second low voltage line; and a first high voltage signal provided by the first high voltage line is different from a second low voltage signal provided by the second low voltage line.

Optionally, the shift register unit further includes a first isolation circuit; the first isolation circuit is electrically coupled to a first control voltage line, the first output node, and a first isolation node, respectively; the first isolation circuit is configured to, under control of a first control voltage provided by the first control voltage line, control communication between the first output node and the first isolation node; the first output node is electrically coupled to the output circuit; and the first isolation node is electrically coupled to the first output node control sub-circuit.

Optionally, the shift register unit further includes a second isolation circuit; the second isolation circuit is electrically coupled to a second control voltage line, the second node, and a second isolation node, respectively; the second isolation circuit is configured to, under control of a second control voltage provided by the second control voltage line, control communication between the second node and the second isolation node; the second node is electrically coupled to the second node control sub-circuit; and the second isolation node is electrically coupled to the third node control sub-circuit.

Optionally, the second node control sub-circuit includes a first transistor and a second transistor; a control electrode of the first transistor is electrically coupled to the first clock signal line; a first electrode of the first transistor is electrically coupled to the third voltage line; a second electrode of the first transistor is electrically coupled to the second node; a control electrode of the second transistor is electrically coupled to the first output node; a first electrode of the second transistor is electrically coupled to the first clock signal line; a second electrode of the second transistor is electrically coupled to the second node; the third node control sub-circuit includes a sixth transistor and a second capacitor; a control electrode of the sixth transistor is electrically coupled to the second node; a first electrode of the sixth transistor is electrically coupled to the second clock signal line; a second electrode of the sixth transistor is electrically coupled to the third node; a first plate of the second capacitor is electrically coupled to the second node; a second plate of the second capacitor is electrically coupled to the third node; the second output node control sub-circuit includes a seventh transistor, an eighth transistor and a third capacitor; a control electrode of the seventh transistor is electrically coupled to the second clock signal line; a first electrode of the seventh transistor is electrically coupled to the third node; a second electrode of the seventh transistor is electrically coupled to the second output node; a control electrode of the eighth transistor is electrically coupled to the first output node; a first electrode of the eighth transistor is electrically coupled to the fourth voltage line; a second electrode of the eighth transistor is electrically coupled to the second output node; a first plate of the third capacitor is electrically coupled to the second output node; and a second plate of the third capacitor is electrically coupled to the first voltage line.

Optionally, the first output node control sub-circuit includes a third transistor, a fourth transistor, a fifth transistor and a first capacitor; a control electrode of the third transistor is electrically coupled to the first clock signal line; a first electrode of the third transistor is electrically coupled to the input terminal; a second electrode of the third transistor is electrically coupled to the first output node; a control electrode of the fourth transistor is electrically coupled to the second clock signal line; a second electrode of the fourth transistor is electrically coupled to the first output node; a control electrode of the fifth transistor is electrically coupled to the second node; a first electrode of the fifth transistor is electrically coupled to the fifth voltage line; a second electrode of the fifth transistor is electrically coupled to a first electrode of the fourth transistor; a first plate of the first capacitor is electrically coupled to the first output node; and a second plate of the first capacitor is electrically coupled to the second clock signal line.

Optionally, the first output node control sub-circuit includes a third transistor, a fourth transistor, a fifth transistor and a first capacitor; a control electrode of the third transistor is electrically coupled to the first clock signal line; a first electrode of the third transistor is electrically coupled to the input terminal; a second electrode of the third transistor is electrically coupled to the first output node; a control electrode of the fourth transistor is electrically coupled to the first output node; a second electrode of the fourth transistor is electrically coupled to the second clock signal line; a control electrode of the fifth transistor is electrically coupled to the second node; a first electrode of the fifth transistor is electrically coupled to the fifth voltage line; a second electrode of the fifth transistor is electrically coupled to a first electrode of the fourth transistor; a first plate of the first capacitor is electrically coupled to the first output node; and a second plate of the first capacitor is electrically coupled to the first electrode of the fourth transistor.

Optionally, the shift register unit further includes a first isolation transistor and a second isolation transistor; a control electrode of the first isolation transistor is electrically coupled to the first control voltage line; a first electrode of the first isolation transistor is electrically coupled to the first isolation node; a second electrode of the first isolation transistor is electrically coupled to the first output node; the first output node is directly electrically coupled to the output circuit; a control electrode of the second isolation transistor is electrically coupled to the second control voltage line; a first electrode of the second isolation transistor is electrically coupled to the second node; a second electrode of the second isolation transistor is electrically coupled to the second isolation node; the second electrode of the third transistor is electrically coupled to the first output node through the first isolation transistor; the second electrode of the third transistor is directly electrically coupled to the first isolation node; the second node is directly electrically coupled to the second node control sub-circuit; and the second isolation node is directly electrically coupled to the third node control sub-circuit.

Optionally, the second node control sub-circuit includes a first transistor and a second transistor; a control electrode of the first transistor is electrically coupled to the first clock signal line; a first electrode of the first transistor is electrically coupled to the third voltage line; a second electrode of the first transistor is electrically coupled to the second node; a control electrode of the second transistor is electrically coupled to the first isolation node; a first electrode of the second transistor is electrically coupled to the first clock signal line; a second electrode of the second transistor is electrically coupled to the second node; the third node control sub-circuit includes a sixth transistor and a second capacitor; a control electrode of the sixth transistor is electrically coupled to the second isolation node; a first electrode of the sixth transistor is electrically coupled to the second clock signal line; a second electrode of the sixth transistor is electrically coupled to the third node; a first plate of the second capacitor is electrically coupled to the second isolation node; a second plate of the second capacitor is electrically coupled to the third node; the second output node control sub-circuit includes a seventh transistor, an eighth transistor and a third capacitor; a control electrode of the seventh transistor is electrically coupled to the second clock signal line; a first electrode of the seventh transistor is electrically coupled to the third node; a second electrode of the seventh transistor is electrically coupled to the second output node; a control electrode of the eighth transistor is electrically coupled to the first isolation node; a first electrode of the eighth transistor is electrically coupled to the fourth voltage line; and a second electrode of the eighth transistor is electrically coupled to the second output node; a first plate of the third capacitor is electrically coupled to the second output node; and a second plate of the third capacitor is electrically coupled to the first voltage line.

Optionally, the output circuit includes a ninth transistor and a tenth transistor; a control electrode of the ninth transistor is electrically coupled to the second output node; a first electrode of the ninth transistor is electrically coupled to the first voltage line; a second electrode of the ninth transistor is electrically coupled to the output terminal; a control electrode of the tenth transistor is electrically coupled to the first output node; a first electrode of the tenth transistor is electrically coupled to the output terminal; and a second electrode of the tenth transistor is electrically coupled to the second voltage line.

In a second aspect, one embodiment of the present disclosure provides a scanning driving circuit, including: multiple stages of shift register units. The shift register unit includes: an output terminal, an output circuit, and an output node control circuit; wherein the output circuit is electrically coupled to a first output node, a second output node, a first voltage line, a second voltage line, and the output terminal, respectively; the output circuit is configured to, write a second voltage signal provided by the second voltage line into the output terminal under control of a potential of the first output node, and write a first voltage signal provided by the first voltage line into the output terminal under control of a potential of the second output node; the output node control circuit is electrically coupled to the first output node, the second output node, a third voltage line, a fourth voltage line, a fifth voltage line, a first clock signal line, a second clock signal line, and an input terminal, respectively; the output node control circuit is configured to control the potential of the first output node and the potential of the second output node, according to a third voltage signal provided by the third voltage line, a fourth voltage signal provided by the fourth voltage line, a fifth voltage signal provided by the fifth voltage line, a first clock signal provided by the first clock signal line, a second clock signal provided by the second clock signal line and an input signal provided by the input terminal; at least one of the third voltage signal, the fourth voltage signal and the fifth voltage signal is different from the first voltage signal and the second voltage signal.

In a third aspect, one embodiment of the present disclosure provides a display substrate, including: a base substrate, a scanning driving circuit and a display area on the base substrate. The scanning driving circuit includes a plurality of foregoing shift register units according to the first aspect. The scanning driving circuit further includes a first voltage line, a second voltage line, a third voltage line, a fourth voltage line, a fifth voltage line, a first clock signal line, and a second clock signal line; each of the first voltage line, the second voltage line, the third voltage line, the fourth voltage line, the fifth voltage line, the first clock signal line, and the second clock signal line extends along a first direction; there is at least one driving transistor in the display area; and the driving transistor is configured to drive a light-emitting element for display.

Optionally, the first voltage line, the fourth voltage line and the fifth voltage line are a first high voltage line; the second voltage line is a first low voltage line; the third voltage line is a second low voltage line; the second low voltage line is located at one side of the first low voltage line away from the display area; the first high voltage line is located between the first low voltage line and the second low voltage line; an orthographic projection of the first high voltage line onto the base substrate at least partially overlaps an orthographic projection of the shift register unit onto the base substrate; the first clock signal line and the second clock signal line are arranged at one side of the second low voltage line away from the display area; the shift register unit is located between the first clock signal line and the first low voltage line; the output circuit in the shift register unit is located between the first low voltage line and the first high voltage line.

Optionally, the first voltage line is a second high voltage line; the second voltage line is a second low voltage line; the third voltage line is a first low voltage line; and the fourth voltage line and the fifth voltage lines are a first high voltage line; the first low voltage line is located at one side of the second low voltage line away from the display area; and the first high voltage line and the second high voltage line are located between the first low voltage line and the second low voltage line; an orthographic projection of the first high voltage line onto the base substrate at least partially overlaps an orthographic projection of the shift register unit onto the base substrate; and an orthographic projection of the second high voltage line onto the base substrate at least partially overlaps the orthographic projection of the shift register unit onto the base substrate; the first high voltage line is located at one side of the second high voltage line away from the second low voltage line; the output circuit in the shift register unit is located between the second low voltage line and the second high voltage line; the first clock signal line and the second clock signal line are arranged at one side of the first low voltage line away from the display area; and the shift register unit is located between the first clock signal line and the second low voltage line.

In a fourth aspect, one embodiment of the present disclosure provides a display device, including the foregoing scanning driving circuit according to the second aspect.

In the shift register unit, the scanning driving circuit, the display substrate and the display device provided in the embodiment of the present application, the output node control circuit controls the potential of the first output node and the potential of the second output node according to the third voltage signal, the fourth voltage signal and the fifth voltage signal, and at least one of the third voltage signal, the fourth voltage signal and the fifth voltage signal is different from the first voltage signal and the second voltage signal, thereby solving problems of inaccurate output of light-emitting control signals due to reduction of transistors included in the output circuit that are electrically coupled to the output terminal and an excessive number of transistors connected to the first voltage line and/or the second voltage line.

Additional aspects and advantages of the present application will be given in the following description, which will become apparent from the following description, or be understood through practice of the present application.

BRIEF DESCRIPTION OF THE DRAWINGS

The foregoing and/or additional aspects and advantages of the present application will become apparent and easy to understand from the following description of the embodiments in conjunction with the accompanying drawings, in which.

DETAILED DESCRIPTION

Figure 1:
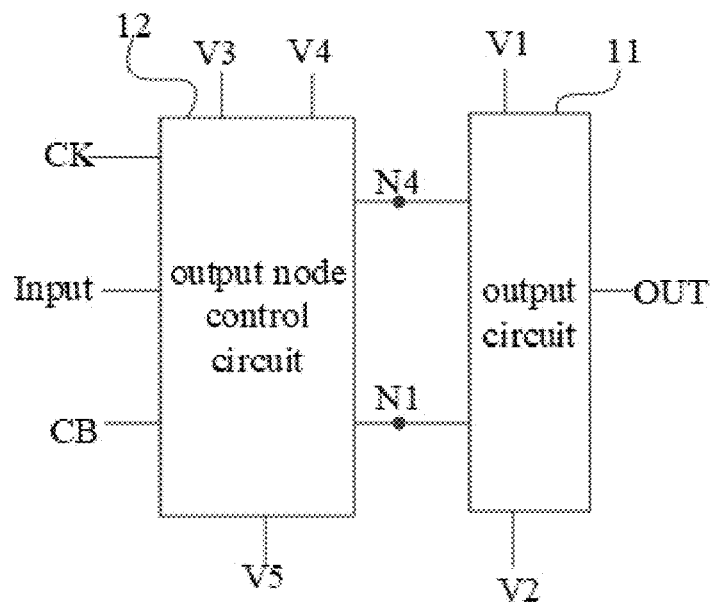
FIG. 1 is a schematic diagram of a shift register unit according to an embodiment of the present application.

The present application is described in detail below. Examples of embodiments of the present application are shown in the drawings, where the same or similar reference numerals indicate the same or similar components or components having the same or similar functions. Further, if detailed descriptions of known technologies are unnecessary for the illustrated features of the present disclosure, they are omitted. The embodiments described below with reference to the drawings are exemplary, and only used to explain the present application, and cannot be construed as limiting the present application.

Transistors used in all embodiments of the present application may be triodes, thin film transistors, field effect transistors, or other devices with the same characteristics. In the embodiment of the present application, in order to distinguish two electrodes of the transistor other than a control terminal, one of the two electrodes is referred as a first terminal, and the other one of the two electrode is referred as a second terminal.

In actual operation, when the transistor is a triode, the control terminal may be a base electrode, the first terminal may be a collector electrode, and the second terminal may be an emitter electrode; or, the control terminal may be a base electrode, the first terminal may be an emitter electrode, and the second terminal may be a collector electrode.

In actual operation, when the transistor is a thin film transistor or a field effect transistor, the control terminal may be a gate electrode, the first terminal may be a drain electrode, and the second terminal may be a source electrode; or the control terminal may be a gate electrode, the first terminal may be a source electrode, and the second terminal may be a drain electrode.

As shown in FIG. 1, a shift register unit according to an embodiment of the present application includes an output terminal OUT, an output circuit 11, and an output node control circuit 12.

The output circuit 11 is electrically coupled to a first output node N1, a second output node N4, a first voltage line V1, a second voltage line V2, and the output terminal OUT, respectively. The output circuit 11 is configured to, under control of a potential of the first output node N1, write a second voltage signal provided by the second voltage line V2 into the output terminal OUT; and, under control of a potential of the second output node N4, write a first voltage signal provided by the first voltage line V1 into the output terminal OUT.

The output node control circuit 12 is electrically coupled to the first output node N1, the second output node N4, a third voltage line V3, a fourth voltage line V4, a fifth voltage line V5, a first clock signal line CK, a second clock signal line CB, and an input terminal Input, respectively. The output node control circuit 12 is configured to control the potential of the first output node N1 and the potential of the second output node N4, according to a third voltage signal provided by the third voltage line V3, a fourth voltage signal provided by the fourth voltage line V4, a fifth voltage signal provided by the fifth voltage line V5, a first clock signal provided by the first clock signal line CK, a second clock signal provided by the second clock signal line CB and an input signal provided by the input terminal Input.

At least one of the third voltage signal, the fourth voltage signal and the fifth voltage signal is different from the first voltage signal and the second voltage signal.

In the shift register unit provided in the embodiment of the present application, the output node control circuit 12 controls the potential of the first output node and the potential of the second output node according to the third voltage signal, the fourth voltage signal and the fifth voltage signal, and at least one of the third voltage signal, the fourth voltage signal and the fifth voltage signal is different from the first voltage signal and the second voltage signal, thereby solving problems of inaccurate output of light-emitting control signals due to reduction of transistors included in the output circuit that are electrically coupled to the output terminal and an excessive number of transistors connected to the first voltage line V1 and/or the second voltage line V2.

Figure 2:
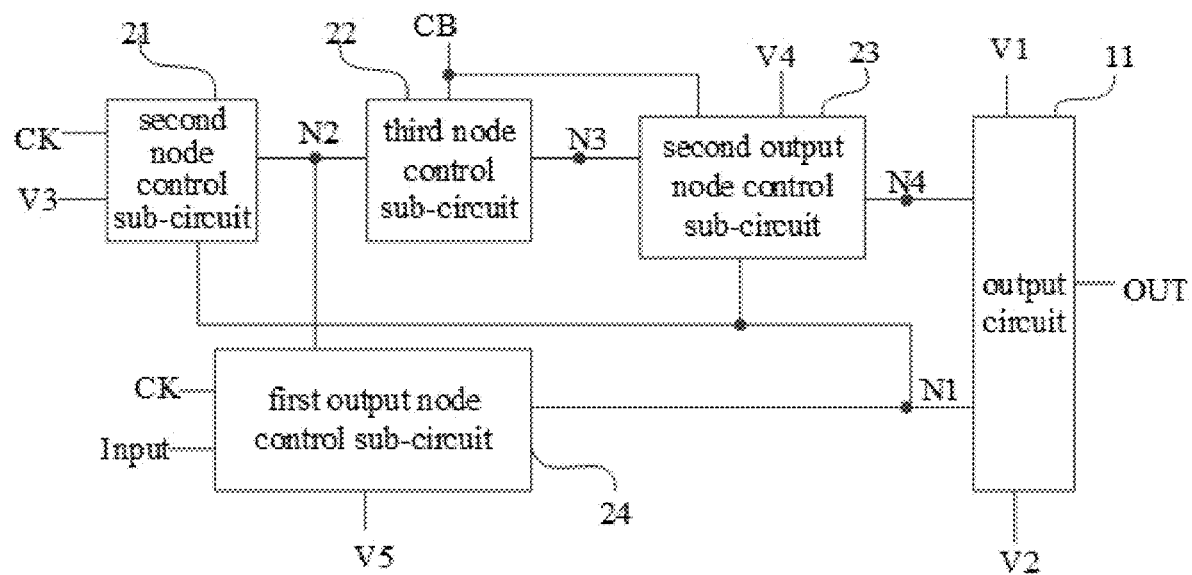
FIG. 2 is a schematic diagram of a shift register unit according to another embodiment of the present application.

In one specific implementation, as shown in FIG. 2, based on the embodiment of the shift register unit shown in FIG. 1, the output node control circuit includes a second node control sub-circuit 21, a third node control sub-circuit 22, a first output node control sub-circuit 24 and a second output node control sub-circuit 23.

The second node control sub-circuit 21 is electrically coupled to the first clock signal line CK, the third voltage line V3, the first output node N1, and a second node N2, respectively. The second node control sub-circuit 21 is configured to, under control of the first clock signal, write the third voltage signal into the second node N2; and under control of the potential of the first output node N1, write the first clock signal into the second node N2.

The third node control sub-circuit 22 is electrically coupled to a third node N3, the second node N2, and the second clock signal line CB, respectively. The third node control sub-circuit 22 is configured to, write the second clock signal into the third node N3 under control of the potential of the second node N2, and adjust the potential of the third node N3 according to the potential of the second node N2.

The second output node control sub-circuit 23 is electrically coupled to the second clock signal line CB, the third node N3, the second output node N4, the fourth voltage line V4, and the first output node N1, respectively. The second output node control sub-circuit 23 is configured to control communication between the third node N3 and the second output node N2 under control of the second clock signal, write the fourth voltage signal provided by the fourth voltage line V4 into the second output node N4 under control of the potential of the first output node N1, and maintain the potential of the second output node N4.

The first output node control sub-circuit 24 is electrically coupled to the first clock signal line CK, the input terminal Input, the second clock signal line CB, the fifth voltage line V5, the second node N2, and the first output node N1, respectively. The first output node control sub-circuit 24 is configured to write the input signal provided by the input terminal Input into the first output node N1 under control of the first clock signal, and write the fifth voltage signal into the first output node N1 under control of the second clock signal and the potential of the second node N2.

When the embodiment of the shift register unit shown in FIG. 2 of the present application is in operation, the second node control sub-circuit 21 writes the third voltage signal into the second node N2 under control of the first clock signal, and writes the first clock signal into the second node N2 under control of the potential of the first output node N1; the third node control sub-circuit 22 writes the second clock signal into the third node N3 under control of the potential of the second node N2, and adjusts the potential of the third node N3 according to the potential of the second node N2; the second output node control sub-circuit 23 controls communication between the third node N3 and the second output node N2 under control of the second clock signal, writes the fourth voltage signal provided by the fourth voltage line V4 into the second output node N4 under control of the potential of the first output node N1, and maintains the potential of the second output node N4; the first output node control sub-circuit 24 writes the input signal provided by the input terminal Input into the first output node N1 under control of the first clock signal, and writes the fifth voltage signal into the first output node N1 under control of the second clock signal and the potential of the second node N2.

Figure 3:
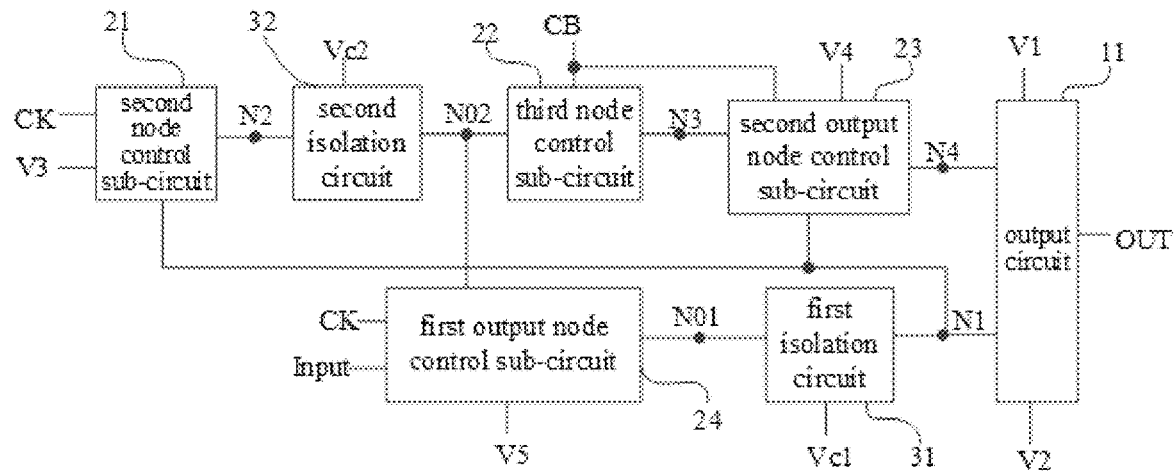
FIG. 3 is a schematic diagram of a shift register unit according to still another embodiment of the present application.

As shown in FIG. 3, based on the embodiment of the shift register unit shown in FIG. 2, the shift register unit in the embodiment of the present application may further include a first isolation circuit 31 and a second isolation circuit 32.

The first isolation circuit 31 is electrically coupled to a first control voltage line Vc1, the first output node N1, and a first isolation node N01, respectively. The first isolation circuit 31 is configured to, under control of a first control voltage provided by the first control voltage line Vc1, control communication between the first output node N1 and the first isolation node N01.

The second isolation circuit 32 is electrically coupled to a second control voltage line Vc2, the second node N2, and a second isolation node N02, respectively. The second isolation circuit 32 is configured to, under control of a second control voltage provided by the second control voltage line Vc2, control communication between the second node N2 and the second isolation node N02.

The first output node N1 is electrically coupled to the output circuit 11, and the first isolation node N01 is electrically coupled to the first output node control sub-circuit 24.

The second node N2 is electrically coupled to the second node control sub-circuit 21, and the second isolation node N02 is electrically coupled to the third node control sub-circuit 22.

In at least one embodiment of the shift register unit shown in FIG. 3, the presence of the first isolation circuit 31 and the second isolation circuit 32 can prevent the potential of the first output node N1 from being too low to affect a potential of the first isolation node N01, and prevent a potential of the second isolation node N02 from being too low to affect the potential of the second node N2.

In at least one embodiment of the shift register unit shown in FIG. 3, the third node control sub-circuit 22 is electrically coupled to the second node N2 through the second isolation circuit 32, and the third node control sub-circuit 22 is directly electrically coupled to the second isolation node N02.

The first output node control sub-circuit 24 is electrically coupled to the first output node N1 through the first isolation circuit 31, and the first output node control sub-circuit 24 is directly electrically coupled to the first isolation node N01.

In at least one embodiment of the present application, when a first isolation transistor included in the first isolation circuit is a p-type transistor, the first control voltage line may be a low voltage line; and when a second isolation transistor included in the second isolation circuit is a p-type transistor, the second control voltage line may be a low voltage line.

In one specific implementation, the first isolation circuit may include a first isolation transistor, and the second isolation circuit may include a second isolation transistor.

A control electrode of the first isolation transistor is electrically coupled to the first control voltage line. A first electrode of the first isolation transistor is electrically coupled to the first isolation node. A second electrode of the first isolation transistor is electrically coupled to the first output node.

A control electrode of the second isolation transistor is electrically coupled to the second control voltage line. A first electrode of the second isolation transistor is electrically coupled to the second node. A second electrode of the second isolation transistor is electrically coupled to the second isolation node.

According to one specific embodiment, the fourth voltage line and the fifth voltage line are both the first voltage line, and the third voltage line is a second low voltage line.

The first voltage line is a first high voltage line, and the second voltage line is a first low voltage line.

A first low voltage signal provided by the first low voltage line is different from a second low voltage signal provided by the second low voltage line.

According to another specific embodiment, the third voltage line is a first low voltage line, and the fourth voltage line and the fifth voltage line are both a first high voltage line.

The first voltage line is a second high voltage line, and the second voltage line is the first low voltage line.

A first high voltage signal provided by the first high voltage line is different from a second high voltage signal provided by the second high voltage line.

According to another specific embodiment, the third voltage line is a first low voltage line, the fourth voltage line is a first high voltage line, the fifth voltage line is a second high voltage line, the first voltage line is a first high voltage line, and the second voltage line is a first low voltage line.

A first high voltage signal provided by the first high voltage line is different from a second high voltage signal provided by the second high voltage line.

According to another specific embodiment, the third voltage line is a first low voltage line, the fourth voltage line is a second high voltage line, the fifth voltage line is a first high voltage line, the first voltage line is a first high voltage line, and the second voltage line is a first low voltage line.

A first high voltage signal provided by the first high voltage line is different from a second high voltage signal provided by the second high voltage line.

According to another specific embodiment, the third voltage line is a first low voltage line, the fourth voltage line and the fifth voltage line are both first high voltage lines, the first voltage line is a second high voltage line, and the second voltage line is a second low voltage line.

A first low voltage signal provided by the first low voltage line is different from a second low voltage signal provided by the second low voltage line, and a first high voltage signal provided by the first high voltage line is different from a second high voltage signal provided by the second high voltage line.

In at least one embodiment of the present application, the first high voltage and the second high voltage may be positive voltages, and the first low voltage and the second low voltage may be negative voltages, which are not limited thereto.

Optionally, the second node control sub-circuit includes a first transistor and a second transistor.

A control electrode of the first transistor is electrically coupled to the first clock signal line. A first electrode of the first transistor is electrically coupled to the third voltage line. A second electrode of the first transistor is electrically coupled to the second node.

A control electrode of the second transistor is electrically coupled to the first output node. A first electrode of the second transistor is electrically coupled to the first clock signal line. A second electrode of the second transistor is electrically coupled to the second node.

The third node control sub-circuit includes a sixth transistor and a second capacitor.

A control electrode of the sixth transistor is electrically coupled to the second node. A first electrode of the sixth transistor is electrically coupled to the second clock signal line. A second electrode of the sixth transistor is electrically coupled to the third node.

A first plate of the second capacitor is electrically coupled to the second node. A second plate of the second capacitor is electrically coupled to the third node.

The second output node control sub-circuit includes a seventh transistor, an eighth transistor and a third capacitor.

A control electrode of the seventh transistor is electrically coupled to the second clock signal line. A first electrode of the seventh transistor is electrically coupled to the third node. A second electrode of the seventh transistor is electrically coupled to the second output node.

A control electrode of the eighth transistor is electrically coupled to the first output node. A first electrode of the eighth transistor is electrically coupled to the fourth voltage line. A second electrode of the eighth transistor is electrically coupled to the second output node.

A first plate of the third capacitor is electrically coupled to the second output node. A second plate of the third capacitor is electrically coupled to the first voltage line.

Optionally, the output circuit includes a ninth transistor and a tenth transistor.

A control electrode of the ninth transistor is electrically coupled to the second output node. A first electrode of the ninth transistor is electrically coupled to the first voltage line. A second electrode of the ninth transistor is electrically coupled to the output terminal.

A control electrode of the tenth transistor is electrically coupled to the first output node. A first electrode of the tenth transistor is electrically coupled to the output terminal. A second electrode of the tenth transistor is electrically coupled to the second voltage line.

According to one specific embodiment, the first output node control sub-circuit includes a third transistor, a fourth transistor, a fifth transistor and a first capacitor.

A control electrode of the third transistor is electrically coupled to the first clock signal line. A first electrode of the third transistor is electrically coupled to the input terminal. A second electrode of the third transistor is electrically coupled to the first output node.

A control electrode of the fourth transistor is electrically coupled to the second clock signal line. A second electrode of the fourth transistor is electrically coupled to the first output node.

A control electrode of the fifth transistor is electrically coupled to the second node. A first electrode of the fifth transistor is electrically coupled to the fifth voltage line. A second electrode of the fifth transistor is electrically coupled to a first electrode of the fourth transistor.

A first plate of the first capacitor is electrically coupled to the first output node. A second plate of the first capacitor is electrically coupled to the second clock signal line.

According to another specific embodiment, the first output node control sub-circuit includes a third transistor, a fourth transistor, a fifth transistor and a first capacitor.

A control electrode of the third transistor is electrically coupled to the first clock signal line. A first electrode of the third transistor is electrically coupled to the input terminal. A second electrode of the third transistor is electrically coupled to the first output node.

A control electrode of the fourth transistor is electrically coupled to the first output node. A second electrode of the fourth transistor is electrically coupled to the second clock signal line.

A control electrode of the fifth transistor is electrically coupled to the second node. A first electrode of the fifth transistor is electrically coupled to the fifth voltage line. A second electrode of the fifth transistor is electrically coupled to a first electrode of the fourth transistor.

A first plate of the first capacitor is electrically coupled to the first output node. A second plate of the first capacitor is electrically coupled to the first electrode of the fourth transistor.

Optionally, the shift register unit in at least one embodiment of the present application further includes a first isolation transistor and a second isolation transistor.

A control electrode of the first isolation transistor is electrically coupled to the first control voltage line. A first electrode of the first isolation transistor is electrically coupled to the first isolation node. A second electrode of the first isolation transistor is electrically coupled to the first output node. The first output node is directly electrically coupled to the output circuit.

A control electrode of the second isolation transistor is electrically coupled to the second control voltage line. A first electrode of the second isolation transistor is electrically coupled to the second node. A second electrode of the second isolation transistor is electrically coupled to the second isolation node.

The second electrode of the third transistor is electrically coupled to the first output node through the first isolation transistor. The second electrode of the third transistor is directly electrically coupled to the first isolation node.

The second node is directly electrically coupled to the second node control sub-circuit. The second isolation node is directly electrically coupled to the third node control sub-circuit.

In one specific implementation, the second node control sub-circuit may include a first transistor and a second transistor.

A control electrode of the first transistor is electrically coupled to the first clock signal line. A first electrode of the first transistor is electrically coupled to the third voltage line. A second electrode of the first transistor is electrically coupled to the second node.

A control electrode of the second transistor is electrically coupled to the first isolation node. A first electrode of the second transistor is electrically coupled to the first clock signal line. A second electrode of the second transistor is electrically coupled to the second node.

The third node control sub-circuit includes a sixth transistor and a second capacitor.

A control electrode of the sixth transistor is electrically coupled to the second isolation node. A first electrode of the sixth transistor is electrically coupled to the second clock signal line. A second electrode of the sixth transistor is electrically coupled to the third node.

A first plate of the second capacitor is electrically coupled to the second isolation node. A second plate of the second capacitor is electrically coupled to the third node.

The second output node control sub-circuit includes a seventh transistor, an eighth transistor and a third capacitor.

A control electrode of the seventh transistor is electrically coupled to the second clock signal line. A first electrode of the seventh transistor is electrically coupled to the third node. A second electrode of the seventh transistor is electrically coupled to the second output node.

A control electrode of the eighth transistor is electrically coupled to the first isolation node. A first electrode of the eighth transistor is electrically coupled to the fourth voltage line. A second electrode of the eighth transistor is electrically coupled to the second output node.

A first plate of the third capacitor is electrically coupled to the second output node. A second plate of the third capacitor is electrically coupled to the first voltage line.

Figure 4:
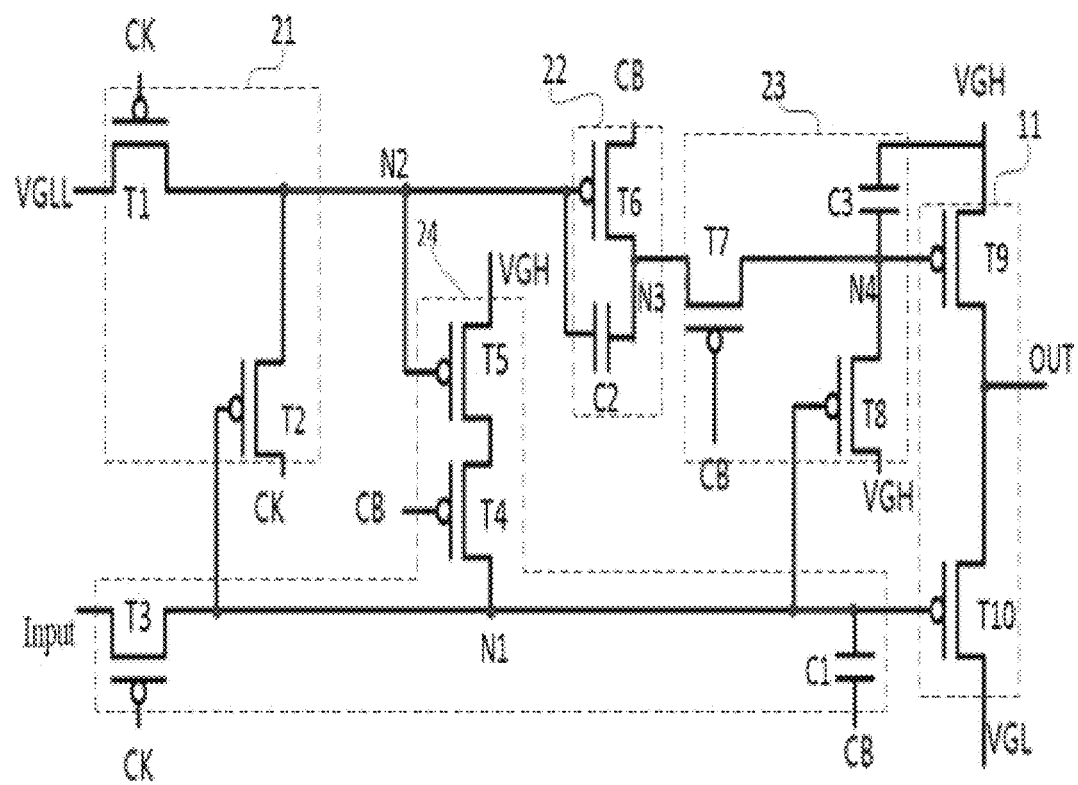
FIG. 4 is a circuit diagram of a shift register unit according to an embodiment of the present application.

As shown in FIG. 4, based on the embodiment of the shift register unit shown in FIG. 2, the second node control sub-circuit 21 includes a first transistor T1 and a second transistor T2.

A gate electrode of the first transistor T1 is electrically coupled to the first clock signal line CK. A source electrode of the first transistor T1 is electrically coupled to the second low voltage line VGLL. A drain electrode of the first transistor T1 is electrically coupled to the second node N2. The second low voltage line VGLL is used to provide a second low voltage.

A gate electrode of the second transistor T2 is electrically coupled to the first output node N1. A source electrode of the second transistor T2 is electrically coupled to the first clock signal line CK. A drain electrode of the second transistor T2 is electrically coupled to the second node N2.

The first output node control sub-circuit 24 includes a third transistor T3, a fourth transistor T4, a fifth transistor T5 and a first capacitor C1.

A gate electrode of the third transistor T3 is electrically coupled to the first clock signal line CK. A source electrode of the third transistor T3 is electrically coupled to the input terminal Input. A drain electrode of the third transistor T3 is electrically coupled to the first output node N1.

A gate electrode of the fourth transistor T4 is electrically coupled to the second clock signal line CB. A drain electrode of the fourth transistor T4 is electrically coupled to the first output node N1.

A gate electrode of the fifth transistor T5 is electrically coupled to the second node N2. A source electrode of the fifth transistor T5 is electrically coupled to the first high voltage line VGH. A drain electrode of the fifth transistor T5 is electrically coupled to a source electrode of the four transistors T4. The first high voltage line VGH is used to provide a first high voltage.

A first plate of the first capacitor C1 is electrically coupled to the first output node N1. A second plate of the first capacitor C1 is electrically coupled to the second clock signal line CB.

The third node control sub-circuit 22 includes a sixth transistor T6 and a second capacitor C2.

A gate electrode of the sixth transistor T6 is electrically coupled to the second node N2. A source electrode of the sixth transistor T6 is electrically coupled to the second clock signal line CB. A drain electrode of the sixth transistor T6 is electrically coupled to the third node N3.

A first plate of the second capacitor C2 is electrically coupled to the second node N2. A second plate of the second capacitor C2 is electrically coupled to the third node N3.

The second output node control sub-circuit 23 includes a seventh transistor T7, an eighth transistor T8 and a third capacitor C3.

A gate electrode of the seventh transistor T7 is electrically coupled to the second clock signal line CB. A source electrode of the seventh transistor T7 is electrically coupled to the third node N3. A drain electrode of the seventh transistor T7 is electrically coupled to the second output node N4.

A gate electrode of the eighth transistor T8 is electrically coupled to the first output node N1. A source electrode of the eighth transistor T8 is electrically coupled to the first high voltage line VGH. A drain electrode of the eighth transistor T8 is electrically coupled to the second output node N4.

A first plate of the third capacitor C3 is electrically coupled to the second output node N4. A second plate of the third capacitor C3 is electrically coupled to the first high voltage line VGH.

The output circuit 11 includes a ninth transistor T9 and a tenth transistor T10.

A gate electrode of the ninth transistor T9 is electrically coupled to the second output node N4. A source electrode of the ninth transistor T9 is electrically coupled to the first high voltage line VGH. A drain electrode of the ninth transistor T9 is electrically coupled to the output terminal OUT. The first high voltage line VGH is used to provide a first high voltage.

A gate electrode of the tenth transistor T10 is electrically coupled to the first output node N1. A source electrode of the tenth transistor T10 is electrically coupled to the output terminal OUT. A drain electrode of the tenth transistor T10 is electrically coupled to the first low voltage line VGL. The first low voltage line VGL is used to provide a first low voltage.

In the embodiment shown in FIG. 4, all the transistors are p-type thin film transistors, but not limited to this.

In the embodiment shown in FIG. 4, the second low voltage line VGLL is different from the first low voltage line VGL.

In the embodiment shown in FIG. 4, the first low voltage line VGL electrically coupled to the drain electrode of the tenth transistor T10, is only used for output, does not need to provide the first low voltage to the source electrode of the third transistor T3, is not interfered by other transistors, and has simple wiring. In addition, since there is a threshold voltage loss when the p-type transistor transmits a low level, the second low voltage line VGLL may be set slightly lower than the first low voltage line VGL. For example, when the first low voltage line VGL is −6V, the second low voltage line VGLL may be −6.5V.

In the embodiment shown in FIG. 4, the fourth voltage line and the fifth voltage line are both the first voltage line, and the third voltage line is the second low voltage line.

The first voltage line is a first high voltage line, and the second voltage line is a first low voltage line.

A first low voltage signal provided by the first low voltage line is different from a second low voltage signal provided by the second low voltage line.

Figure 5:
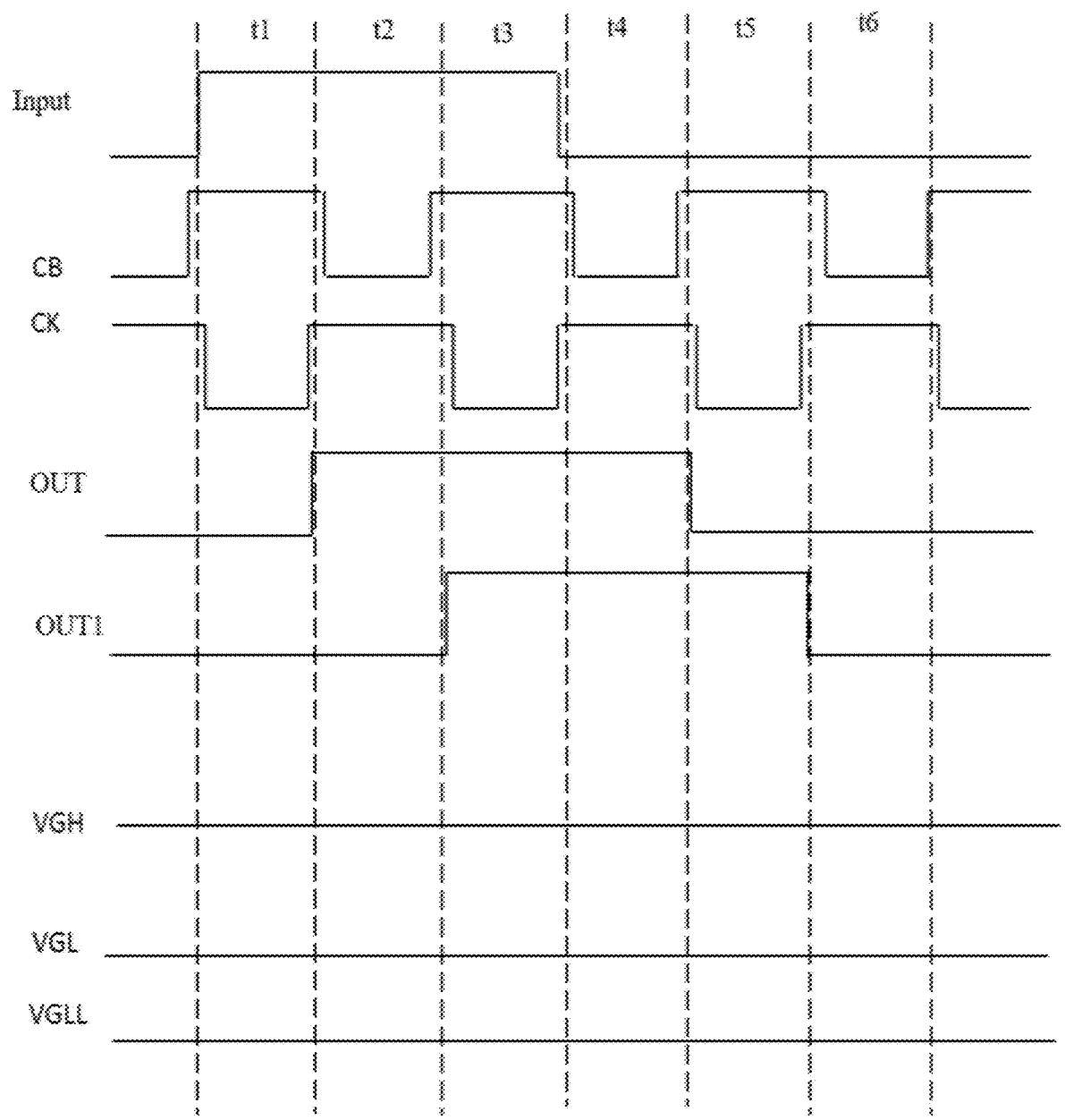
FIG. 5 is an operation timing sequence diagram of the shift register unit shown in FIG. 4 according to an embodiment of the present application.

As shown in FIG. 5, when the embodiment of the shift register unit shown in FIG. 4 of the present application is in operation, there are following six stages.

In a first stage t1, the input terminal Input provides a high voltage, the second clock signal line CB provides a high voltage, the first clock signal line CK provides a low voltage, the third transistor T3 is turned on, the high voltage provided by the input terminal Input is written into the first output node N1; the first transistor T1 is turned on, a low voltage provided by the second low voltage line VGLL is written into the second node N2; the sixth transistor T6 is turned on, and a potential of the third node N3 is a high voltage; the fourth transistor T4 is turned off, the seventh transistor T7 is turned off, the eighth transistor T8 is turned off, the ninth transistor T9 is turned off, and the tenth transistor T10 is turned off; a potential of a light-emitting control signal output by the output terminal OUT is maintained at a low voltage.

In a second stage t2, the input terminal Input provides a high voltage, the second clock signal line CB provides a low voltage, the first clock signal line CK provides a high voltage, the first transistor T1 is turned off, and the third transistor T3 is turned off, the second transistor T2 is turned off, the potential of the second node N2 is maintained at a low voltage, the sixth transistor T6 is turned on, the seventh transistor T7 is turned on, and a potential of the second output node N4 is a low voltage; the fourth transistor T4 and the fifth transistor T5 are turned on, the potential of the first output node N1 is a high voltage; the ninth transistor T9 is turned on, the tenth transistor T10 is turned off, and the output terminal OUT outputs the first high voltage provided by the first high voltage line VGH.

In a third stage t3, the input terminal Input provides a high voltage, the second clock signal line CB provides a high voltage, the first clock signal line CK provides a low voltage, the first transistor T1 and the third transistor T3 are turned on, the potential of the first output node N1 is a high voltage, the potential of the second node N2 is a second low voltage provided by the second low voltage line VGLL; the sixth transistor T6 is turned on, the fifth transistor T5 is turned on, the fourth transistor T4 is turned off, and the potential of the third node N3 is a high voltage; the seventh transistor T7 is turned off, the eighth transistor T8 is turned off, and a potential of the second output node N4 is maintained at a low voltage; the ninth transistor T9 is turned on, the tenth transistor T10 is turned off, and the output terminal OUT outputs the first high voltage provided by the first high voltage line VGH.

In a fourth stage t4, the input terminal Input provides a low voltage, the second clock signal line CB provides a low voltage, the first clock signal line CK provides a high voltage, the first transistor T1 and the third transistor T3 are all turned off, the potential of the first output node N1 is maintained at a high voltage, the second transistor T2 is turned off, the potential of the second node N2 is maintained at a low voltage; the sixth transistor T6 is turned on, the seventh transistor T7 is turned on, and the potential of the second output node N4 is a low voltage; the ninth transistor T9 is turned on, the tenth transistor T10 is turned off, and the output terminal OUT outputs the first high voltage provided by the first high voltage line VGH.

In a fifth stage t5, the input terminal Input provides a low voltage, the second clock signal line CB provides a high voltage, the first clock signal line CK provides a low voltage, the first transistor T1 and the third transistor T3 are turned on, the potential of the first output node N1 becomes a low voltage, the potential of the second node N2 is a low voltage, the eighth transistor T8 is turned on, and the potential of the second output node N4 becomes a high voltage; the ninth transistor T9 is turned off, the tenth transistor T10 is turned on, and the output terminal OUT outputs a first low voltage provided by the first low voltage line VGL.

In a sixth stage t6, the input terminal Input provides a low voltage, the second clock signal line CB provides a low voltage, the first clock signal line CK provides a high voltage, the first transistor T1 and the third transistor T3 are turned off, the potential of the first output node N1 is maintained at a low voltage, the second transistor T2 is turned on, the potential of the second node N2 becomes a high voltage, the eighth transistor T8 is turned on, and the potential of the second output node N4 becomes a high voltage; the ninth transistor T9 is turned off, the tenth transistor T10 is turned on, and the output terminal OUT outputs the first low voltage provided by the first low voltage line VGL.

In FIG. 5, an output terminal of a next-level shift register unit adjacent to the shift register unit shown in FIG. 4 is labeled OUT1.

Figure 6:
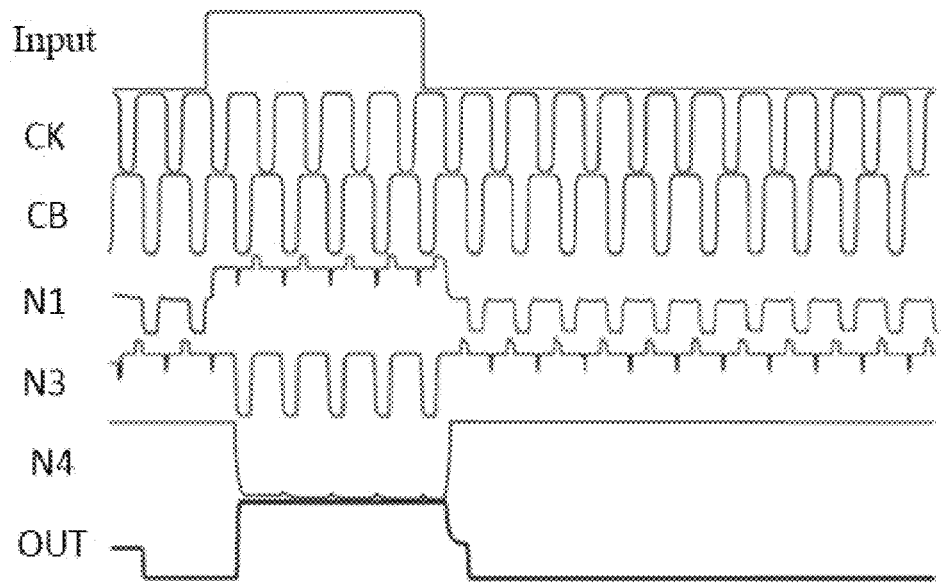
FIG. 6 is a simulation waveform diagram of the shift register unit shown in FIG. 4 according to an embodiment of the present application.

FIG. 6 is a simulation operation timing sequence diagram of the shift register unit shown in FIG. 4 according to an embodiment of the present application.

Figure 7:
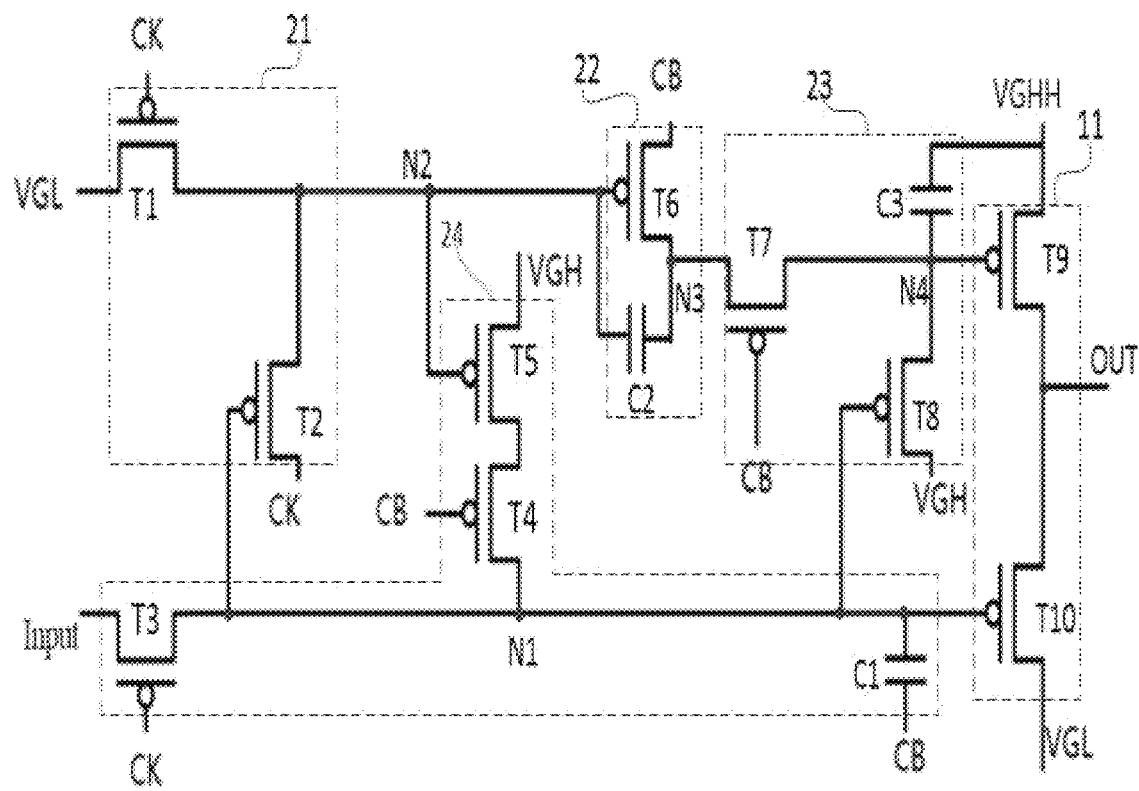
FIG. 7 is a circuit diagram of a shift register unit according to an embodiment of the present application.

The difference between the embodiment of the shift register unit shown in FIG. 7 of the present application and the embodiment of the shift register unit shown in FIG. 4 of the present application is that the source electrode of the ninth transistor T9 is electrically coupled to a second high voltage line VGHH, and the second high voltage line VGHH is used to provide a second high voltage; the source electrode of the first transistor T1 is electrically coupled to the first low voltage line VGL, and the first low voltage line VGL is used to provide a first low voltage.

In at least one embodiment of the present application, the second high voltage is different from the first high voltage, and the first high voltage line VGH is different from the second high voltage line VGHH.

In the embodiment of the shift register unit shown in FIG. 7 of the present application, since there are many transistors electrically coupled to the first high voltage line VGH, the first high voltage provided by the first high voltage line VGH is greatly disturbed; the second high voltage provided by the second high voltage line VGHH is received by the ninth transistor T9, thereby preventing the output light-emitting control signal from being affected by disturbance of the first high voltage provided by the first high voltage line VGH.

In the embodiment of the shift register unit shown in FIG. 7, the third voltage line is a first low voltage line, and both the fourth voltage line and the fifth voltage line are first high voltage lines.

The first voltage line is a second high voltage line, and the second voltage line is a first low voltage line.

The first high voltage signal provided by the first high voltage line is different from the second high voltage signal provided by the second high voltage line.

Figure 8:
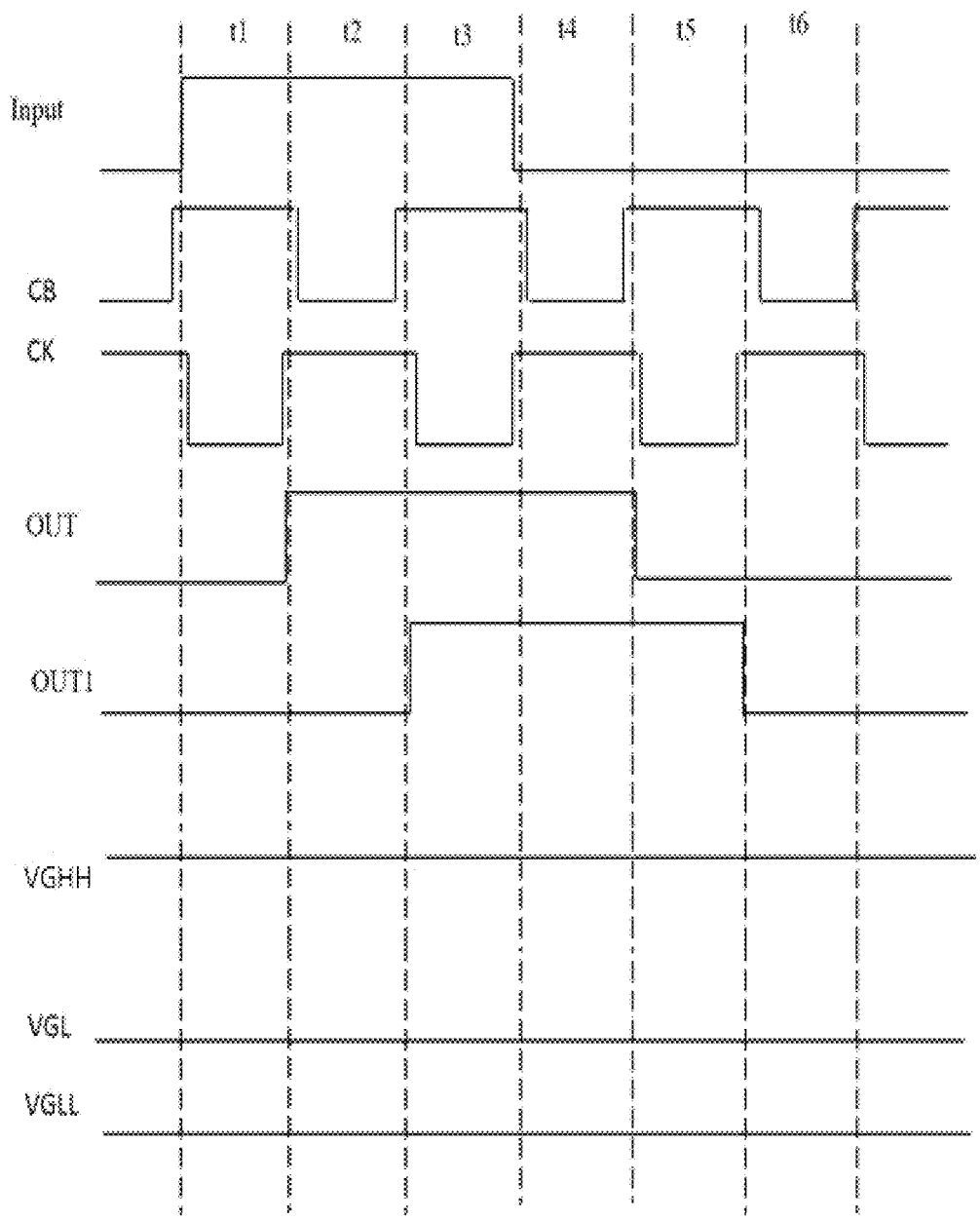
FIG. 8 is an operation timing sequence diagram of the shift register unit shown in FIG. 7 according to an embodiment of the present application.

As shown in FIG. 8, when the embodiment of the shift register unit shown in FIG. 7 of the present application is in operation, there are following six stages.

In a first stage t1, the input terminal Input provides a high voltage, the second clock signal line CB provides a high voltage, the first clock signal line CK provides a low voltage, the third transistor T3 is turned on, and the high voltage provided by the input terminal Input is written to the first output node N1; the first transistor T1 is turned on, and the first low voltage provided by the first low voltage line VGL is written to the second node N2; the sixth transistor T6 is turned on, and a potential of the third node N3 is a high voltage; the fourth transistor T4 is turned off, the seventh transistor T7 is turned off, the eighth transistor T8 is turned off, the ninth transistor T9 is turned off, the tenth transistor T10 is turned off, and a potential of the light-emitting control signal output by the output terminal OUT is maintained at a low voltage.

In a second stage t2, the input terminal Input provides a high voltage, the second clock signal line CB provides a low voltage, the first clock signal line CK provides a high voltage, the first transistor T1 is turned off, the third transistor T3 is turned off, the second transistor T2 is turned off, and the potential of the second node N2 is maintained at a low voltage; the sixth transistor T6 is turned on, the seventh transistor T7 is turned on, and the potential of the second output node N4 is a low voltage; the fourth transistor T4 and the fifth transistor T5 are turned on, and the potential of the first output node N1 is a high voltage; the ninth transistor T9 is turned on, the tenth transistor T10 is turned off, and the output terminal OUT outputs the second high voltage provided by the second high voltage line VGHH.

In a third phase t3, the input terminal Input provides a high voltage, the second clock signal line CB provides a high voltage, the first clock signal line CK provides a low voltage, the first transistor T1 and the third transistor T3 are turned on, the potential of the first output node N1 is a high voltage, and the potential of the second node N2 is a first low voltage provided by the first low voltage line VGL; the sixth transistor T6 is turned on, the fifth transistor T5 is turned on, the fourth transistor T4 is turned off, and the potential of the third node N3 is a high voltage; the seventh transistor T7 is turned off, the eighth transistor T8 is turned off, and the potential of the second output node N4 is maintained at a low voltage; the ninth transistor T9 is turned on, the tenth transistor T10 is turned off, and the output terminal OUT outputs the second high voltage provided by the second high voltage line VGHH.

In a fourth stage t4, the input terminal Input provides a low voltage, the second clock signal line CB provides a low voltage, the first clock signal line CK provides a high voltage, the first transistor T1 and the third transistor T3 are turned off, the potential of the first output node N1 is maintained at a high voltage, the second transistor T2 is turned off, and the potential of the second node N2 is maintained at a low voltage; the sixth transistor T6 is turned on, the seventh transistor T7 is turned on, and the potential of the second output node N4 is a low voltage; the ninth transistor T9 is turned on, the tenth transistor T10 is turned off, and the output terminal OUT outputs the second high voltage provided by the second high voltage line VGHH.

In a fifth stage t5, the input terminal Input provides a low voltage, the second clock signal line CB provides a high voltage, the first clock signal line CK provides a low voltage, the first transistor T1 and the third transistor T3 are turned on, the potential of the first output node N1 becomes a low voltage, and the potential of the second node N2 is a low voltage; the eighth transistor T8 is turned on, and the potential of the second output node N4 becomes a high voltage; the ninth transistor T9 is turned off, the tenth transistor T10 is turned on, and the output terminal OUT outputs the first low voltage provided by the first low voltage line VGL.

In a sixth stage t6, the input terminal Input provides a low voltage, the second clock signal line CB provides a low voltage, the first clock signal line CK provides a high voltage, the first transistor T1 and the third transistor T3 are turned off, the potential of the first output node N1 is maintained at a low voltage, the second transistor T2 is turned on, the potential of the second node N2 becomes a high voltage; the eighth transistor T8 is turned on, and the potential of the second output node N4 becomes a high voltage; the ninth transistor T9 is turned off, the tenth transistor T10 is turned on, and the output terminal OUT outputs the first low voltage provided by the first low voltage line VGL.

In FIG. 8, an output terminal of a next-level shift register unit adjacent to the shift register unit shown in FIG. 4 is labeled OUT1.

Figure 9:
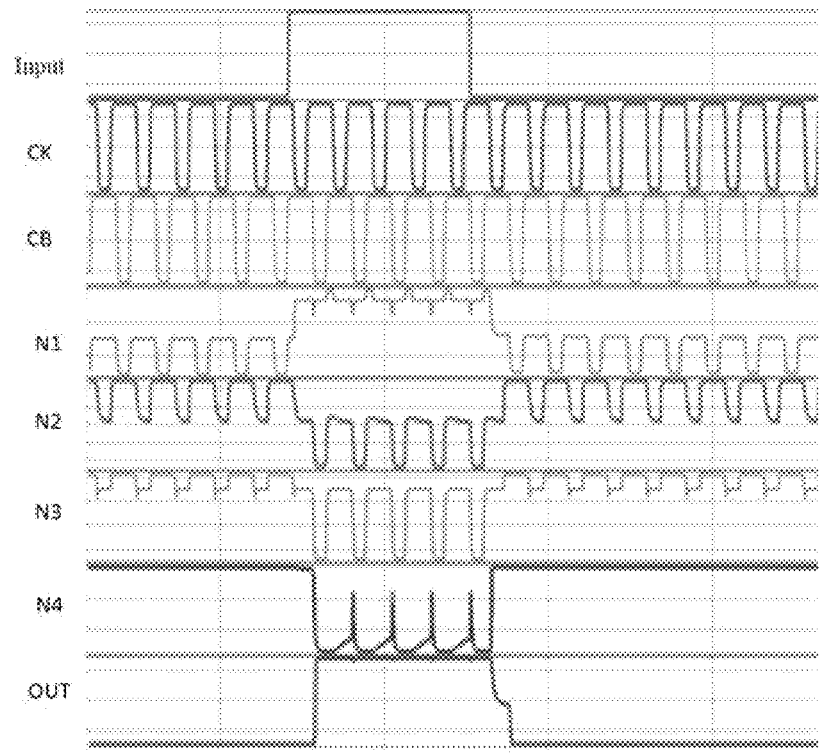
FIG. 9 is a simulation waveform diagram of the shift register unit shown in FIG. 7 according to an embodiment of the present application.

FIG. 9 is a simulation operation timing sequence diagram of the shift register unit shown in FIG. 7 according to an embodiment of the present application.

Figure 10:
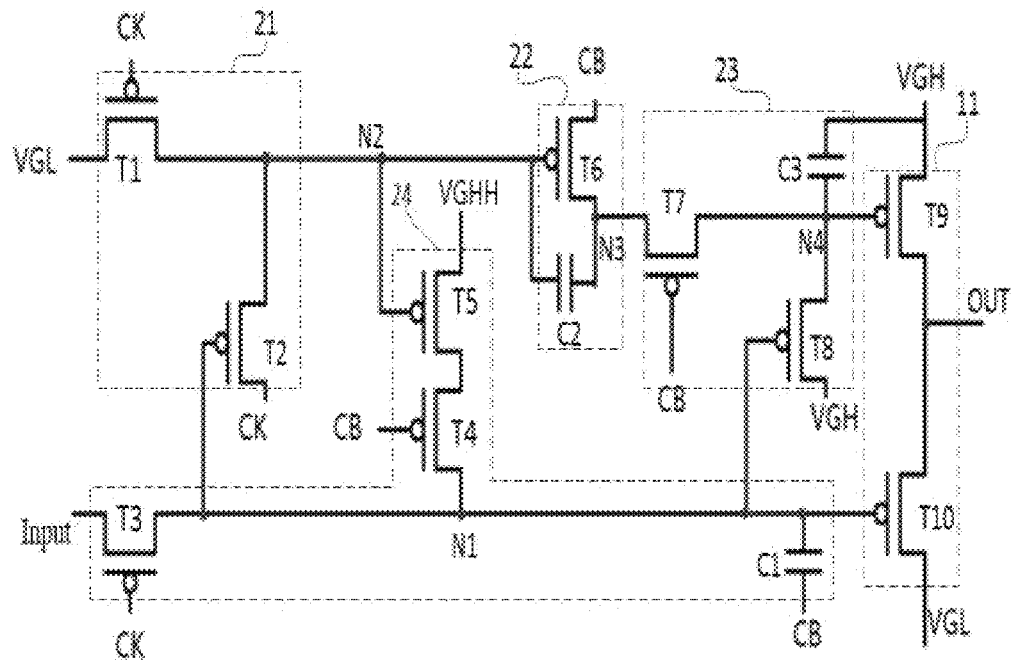
FIG. 10 is a circuit diagram of a shift register unit according to another embodiment of the present application.

The difference between the embodiment of the shift register unit shown in FIG. 10 of the present application and the embodiment of the shift register unit shown in FIG. 7 of the present application is that: the source electrode of the fifth transistor T5 is electrically coupled to the second high voltage line VGHH, and the second high voltage line VGHH is used to provide a second high voltage; the source electrode of the ninth transistor T9 is electrically coupled to the first high voltage line VGH, and the first high voltage line VGH is used to provide a first high voltage.

In at least one embodiment of the present application, the second high voltage is different from the first high voltage, and the first high voltage line VGH is different from the second high voltage line VGHH.

In the embodiment of the shift register unit shown in FIG. 10, the third voltage line is a first low voltage line, the fourth voltage line is a first high voltage line, the fifth voltage line is a second voltage line, the first voltage line is a first high voltage line, and the second voltage line is a first low voltage line.

The first high voltage signal provided by the first high voltage line is different from the second high voltage signal provided by the second high voltage line.

When the embodiment of the shill register unit shown in FIG. 10 of the present application is in operation, there are following six stages.

In a first stage, the input terminal Input provides a high voltage, the second clock signal line CB provides a high voltage, the first clock signal line CK provides a low voltage, the third transistor T3 is turned on, the high voltage provided by the input terminal Input is written into the first output node N1; the first transistor T1 is turned on, and the first low voltage provided by the first low voltage line VGL is written to the second node N2; the sixth transistor T6 is turned on, and the potential of the third node N3 is a high voltage; the fourth transistor T4 is turned off, the seventh transistor T7 is turned off, the eighth transistor T8 is turned off, the ninth transistor T9 is turned off, the tenth transistor T10 is turned off, and the potential of the light-emitting control signal output by the output terminal OUT is maintained at a low voltage.

In a second stage, the input terminal Input provides a high voltage, the second clock signal line CB provides a low voltage, the first clock signal line CK provides a high voltage, the first transistor T1 is turned off, the third transistor T3 is turned off, the second transistor T2 is turned off, the potential of the second node N2 is maintained at a low voltage, the sixth transistor T6 is turned on, the seventh transistor T7 is turned on, and the potential of the second output node N4 is a low voltage; the fourth transistor T4 and the fifth transistor T5 are turned on, and the potential of the first output node N1 is a high voltage; the ninth transistor T9 is turned on, the tenth transistor T10 is turned off, and the output terminal OUT outputs the first high voltage provided by the first high voltage line VGH.

In a third stage, the input terminal Input provides a high voltage, the second clock signal line CB provides a high voltage, the first clock signal line CK provides a low voltage, the first transistor T1 and the third transistor T3 are turned on, the potential of the first output node N1 is a high voltage, and the potential of the second node N2 is the first low voltage provided by the first low voltage line VGL; the sixth transistor T6 is turned on, the fifth transistor T5 is turned on, the fourth transistor T4 is turned off, and the potential of the third node N3 is high voltage; the seventh transistor T7 is turned off, the eighth transistor T8 is turned off, and the potential of the second output node N4 is maintained at a low voltage; the ninth transistor T9 is turned on, the tenth transistor T10 is turned off, and the output terminal OUT outputs the first high voltage provided by the first high voltage line VGH.

In a fourth stage, the input terminal Input provides a low voltage, the second clock signal line CB provides a low voltage, the first clock signal line CK provides a high voltage, the first transistor T1 and the third transistor T3 are turned off, the potential of the first output node N1 is maintained at a high voltage, the second transistor T2 is turned oft and the potential of the second node N2 is maintained at a low voltage; the sixth transistor T6 is turned on, the seventh transistor T7 is turned on, and the potential of the second output node N4 is low voltage; the ninth transistor T9 is turned on, the tenth transistor T10 is turned off, and the output terminal OUT outputs a high voltage provided by the first high voltage line VGH.

In a fifth stage, the input terminal Input provides a low voltage, the second clock signal line CB provides a high voltage, the first clock signal line CK provides a low voltage, the first transistor T1 and the third transistor T3 are turned on, the potential of the first output node N1 becomes a low voltage, and the potential of the second node N2 is a low voltage; the eighth transistor T8 is turned on, and the potential of the second output node N4 becomes a high voltage; the ninth transistor T9 is turned off, the tenth transistor T10 is turned on, and the output terminal OUT outputs the first low voltage provided by the first low voltage line VGL.

In a sixth stage, the input terminal Input provides a low voltage, the second clock signal line CB provides a low voltage, the first clock signal line CK provides a high voltage, the first transistor T1 and the third transistor T3 are turned off, the potential of the first output node N1 is maintained at a low voltage, the second transistor T2 is turned on, and the potential of the second node N2 becomes a high voltage; the eighth transistor T8 is turned on, and the potential of the second output node N4 becomes a high voltage; the ninth transistor T9 is turned off, the tenth transistor T10 is turned on, and the output terminal OUT outputs the first low voltage provided by the first low voltage line VGL.

Figure 11:
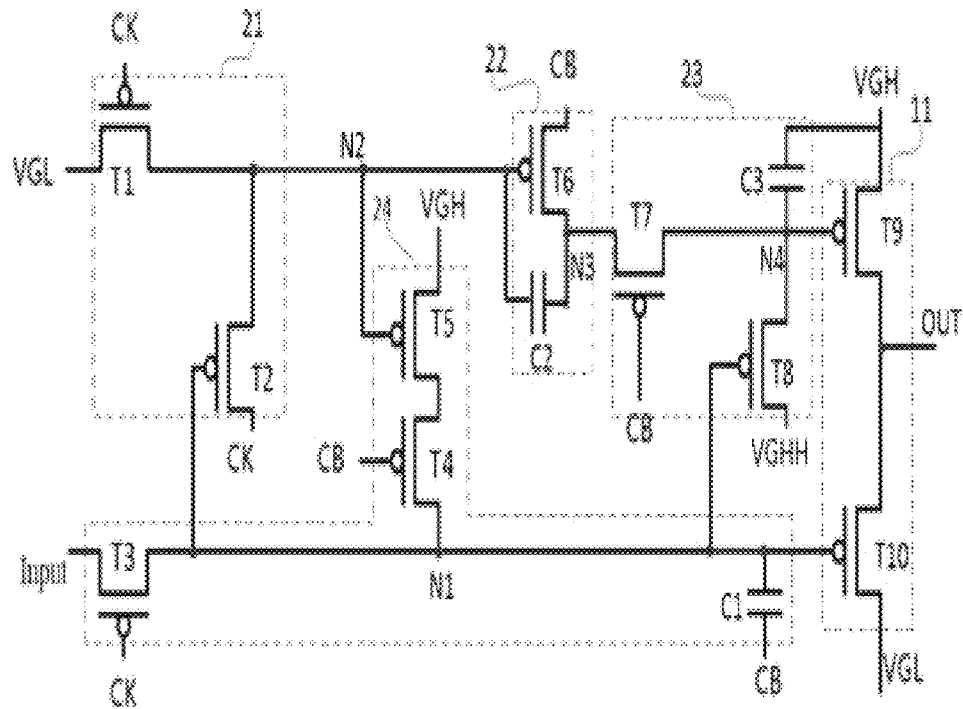
FIG. 11 is a circuit diagram of a shift register unit according to still another embodiment of the present application.

The difference between the embodiment of the shift register unit shown in FIG. 11 of the present application and the embodiment of the shift register unit shown in FIG. 10 of the present application is that: the source electrode of the fifth transistor T5 is electrically coupled to the first high voltage line VGH; the source electrode of the eighth transistor T8 is electrically coupled to the second high voltage line VGHH; the first high voltage line VGH is used to provide a first high voltage, and the second high voltage line VGHH is used to provide a second high voltage.

In at least one embodiment of the present application, the second high voltage is different from the first high voltage, and the first high voltage line VGH is different from the second high voltage line VGHH.

In the embodiment of the shift register unit shown in FIG. 11 of the present application, the third voltage line is a first low voltage line, the fourth voltage line is a second high voltage line, the fifth voltage line is a first high voltage line, the first voltage line is a first high voltage line, and the second voltage line is a first low voltage line.

The first high voltage signal provided by the first high voltage line is different from the second high voltage signal provided by the second high voltage line.

When the embodiment of the shift register unit shown in FIG. 11 of the present application is in operation, in case that the potential of the first output node N1 is a high voltage, the tenth transistor T10 needs to be turned off, and then, the second high voltage provided by the second high voltage line VGHH is set to be less than the first high voltage provided by the first high voltage line VGH, so that the eighth transistor T8 is turned off to ensure that the potential of the second output node N4 is a low voltage.

When the embodiment of the shift register unit shown in FIG. 11 of the present application is in operation, there are following six stages.

In a first stage, the input terminal Input provides a high voltage, the second clock signal line CB provides a high voltage, the first clock signal line CK provides a low voltage, the third transistor T3 is turned on, and the high voltage provided by the input terminal Input is written into the first output node N1; the first transistor T1 is turned on, and the first low voltage provided by the first low voltage line VGL is written to the second node N2; the sixth transistor T6 is turned on, and the potential of the third node N3 is a high voltage; the fourth transistor T4 is turned off, the seventh transistor T7 is turned off, the eighth transistor T8 is turned off, the ninth transistor 19 is turned off, the tenth transistor T10 is turned off, and a potential of a light-emitting control signal output by the output terminal OUT is maintained at a low voltage.

In a second stage, the input terminal Input provides a high voltage, the second clock signal line CB provides a low voltage, the first clock signal line CK provides a high voltage, the first transistor T1 is turned off, the third transistor T3 is turned off, the second transistor T2 is turned off, and the potential of the second node N2 is maintained at a low voltage; the sixth transistor T6 is turned on, the seventh transistor T7 is turned on, and the potential of the second output node N4 is a low voltage; the fourth transistor T4 and the fifth transistor T5 are turned on, and the potential of the first output node N1 is a high voltage; the ninth transistor T9 is turned on, the tenth transistor T10 is turned off, and the output terminal OUT outputs the first high voltage provided by the first high voltage line VGH.

In a third stage, the input terminal Input provides a high voltage, the second clock signal line CB provides a high voltage, the first clock signal line CK provides a low voltage, the first transistor T1 and the third transistor T3 are turned on, the potential of the first output node N1 is a high voltage, and the potential of the second node N2 is a first low voltage provided by the first low voltage line VGL; the sixth transistor T6 is turned on, the fifth transistor T5 is turned on, the fourth transistor T4 is turned off, and the potential of the third node N3 is high voltage; the seventh transistor T7 is turned off, the eighth transistor T8 is turned off, and the potential of the second output node N4 is maintained at a low voltage; the ninth transistor T9 is turned on, the tenth transistor T10 is turned off, and the output terminal OUT outputs the first high voltage provided by the first high voltage line VGH.

In a fourth stage, the input terminal Input provides a low voltage, the second clock signal line CB provides a low voltage, the first clock signal line CK provides a high voltage, the first transistor T1 and the third transistor T3 are turned off, the potential of the first output node N1 is maintained at a high voltage, the second transistor T2 is turned off, and the potential of the second node N2 is maintained at a low voltage; the sixth transistor T6 is turned on, the seventh transistor T7 is turned on, and the potential of the second output node N4 is a low voltage; the ninth transistor T9 is turned on, the tenth transistor T10 is turned off, and the output terminal OUT outputs the first high voltage provided by the first high voltage line VGH.

In a fifth stage, the input terminal Input provides a low voltage, the second clock signal line CB provides a high voltage, the first clock signal line CK provides a low voltage, the first transistor T1 and the third transistor T3 are turned on, the potential of the first output node N1 becomes a low voltage, and the potential of the second node N2 is a low voltage; the eighth transistor T8 is turned on, and the potential of the second output node N4 becomes a high voltage; the ninth transistor T9 is turned off, the tenth transistor T10 is turned on, and the output terminal OUT outputs the first low voltage provided by the first low voltage line VGL.

In a sixth stage, the input terminal Input provides a low voltage, the second clock signal line CB provides a low voltage, the first clock signal line CK provides a high voltage, the first transistor T1 and the third transistor T3 are turned off, the potential of the first output node N1 is maintained at a low voltage, the second transistor T2 is turned on, and the potential of the second node N2 becomes a high voltage; the eighth transistor T8 is turned on, and the potential of the second output node N4 becomes a high voltage; the ninth transistor T9 is turned off, the tenth transistor T10 is turned on, and the output terminal OUT outputs the first low voltage provided by the first low voltage line VGL.

Figure 12:
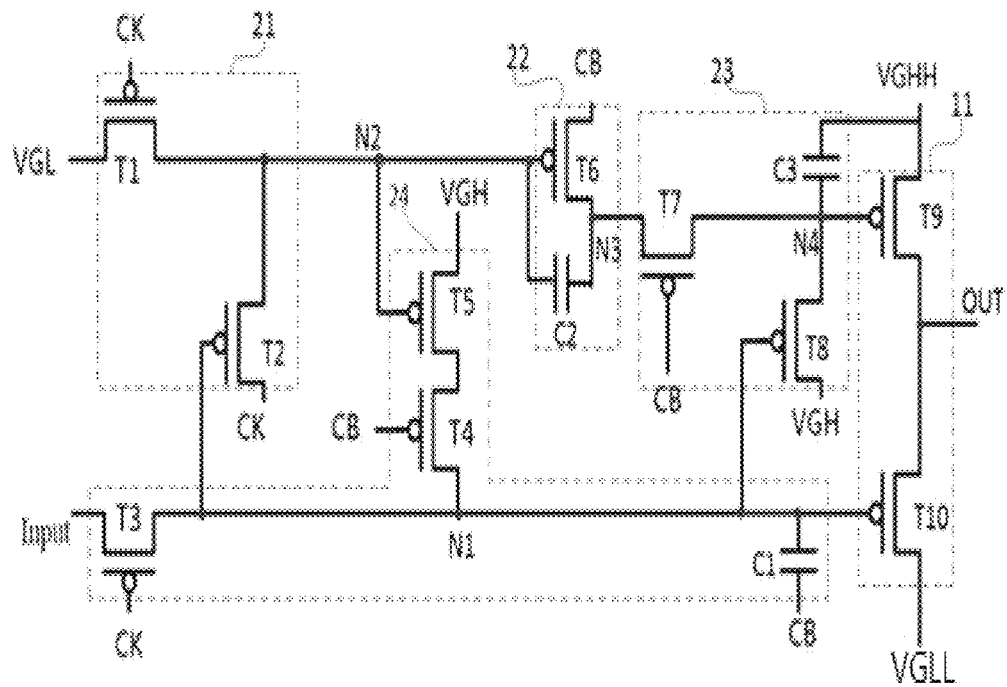
FIG. 12 is a circuit diagram of a shift register unit according to yet another embodiment of the present application.

The difference between the embodiment of the shift register unit shown in FIG. 12 of the present application and the embodiment of the shift register unit shown in FIG. 11 of the present application is that: the source electrode of the ninth transistor T9 is electrically coupled to the second high voltage line VGHH; the source electrode of the tenth transistor T10 is electrically coupled to the second low voltage line VGLL; and the source electrode of the eighth transistor T8 is electrically coupled to the first high voltage line VGH.

The second high voltage line VGHH is used to provide a second high voltage, the second low voltage line VGLL is used to provide a second low voltage, and the first high voltage line VGH is used to provide a first high voltage.

In the embodiment of the shift register unit shown in FIG. 12 of the present application, the second high voltage line VGHH electrically coupled to the ninth transistor T9 is only used for output, the second low voltage line VGLL electrically coupled to the tenth transistor T10 is also only used for output, the second high voltage line VGHH is not electrically coupled to other transistors except for the ninth transistor T9, and the second low voltage line VGLL is not electrically coupled to other transistors except for the tenth transistor T10. In this way, the second high voltage line VGHH and the second low voltage line VGLL are not interfered by other transistors, thereby ensuring stability of an output light-emitting control signal.

In at least one embodiment of the present application, the second high voltage is different from the first high voltage; the first high voltage line VGH is different from the second high voltage line VGHH; the second low voltage is different from the first low voltage, and the first low voltage line VGL is different from the second low voltage line VGLL.

In the embodiment of the shift register unit shown in FIG. 12 of the present application, the third voltage line is a first low voltage line, and the fourth voltage line and the fifth voltage line are first high voltage lines; the first voltage line is a second high voltage line, and the second voltage line is a second low voltage line.

When the embodiment of the shift register unit shown in FIG. 12 of the present application is in operation, there are following six stages.

In a first stage, the input terminal Input provides a high voltage, the second clock signal line CB provides a high voltage, the first clock signal line CK provides a low voltage, the third transistor T3 is turned on, and the high voltage provided by the input terminal Input is written into the first output node N1; the first transistor T1 is turned on, and the first low voltage provided by the first low voltage line VGL is written into the second node N2; the sixth transistor T6 is turned on, and the potential of the third node N3 is a high voltage; the fourth transistor T4 is turned off, the seventh transistor T7 is turned off, the eighth transistor T8 is turned off, the ninth transistor T9 is turned off, the tenth transistor T9 is turned off, and a potential of a light-emitting control signal output by the output terminal OUT is maintained at a low voltage.

In a second stage, the input terminal Input provides a high voltage, the second clock signal line CB provides a low voltage, the first clock signal line CK provides a high voltage, the first transistor T1 is turned off, the third transistor T3 is turned off, the second transistor T2 is turned oft and the potential of the second node N2 is maintained at a low voltage; the sixth transistor T6 is turned on, the seventh transistor T7 is turned on, and the potential of the second output node N4 is a low voltage; the fourth transistor T4 and the fifth transistor T5 are turned on, and the potential of the first output node N1 is a high voltage; the ninth transistor T9 is turned on, the tenth transistor T10 is turned off, and the output terminal OUT outputs the second high voltage provided by the second high voltage line VGHH.

In a third stage, the input terminal Input provides a high voltage, the second clock signal line CB provides a high voltage, the first clock signal line CK provides a low voltage, the first transistor T1 and the third transistor T3 are turned on, the potential of the first output node N1 is a high voltage, and the potential of the second node N2 is a first low voltage provided by the first low voltage line VGL; the sixth transistor T6 is turned on, the fifth transistor T5 is turned on, the fourth transistor T4 is turned off, and the potential of the third node N3 is a high voltage; the seventh transistor T7 is turned off, the eighth transistor T8 is turned off, and the potential of the second output node N4 is maintained at a low voltage; the ninth transistor T9 is turned on, the tenth transistor T10 is turned off, and the output terminal OUT outputs the second high voltage provided by the second high voltage line VGHH.

In a fourth stage, the input terminal Input provides a low voltage, the second clock signal line CB provides a low voltage, the first clock signal line CK provides a high voltage, the first transistor T1 and the third transistor T3 are turned off, the potential of the first output node N1 is maintained at a high voltage, the second transistor T2 is turned off, and the potential of the second node N2 is maintained at a low voltage; the sixth transistor T6 is turned on, the seventh transistor T7 is turned on, and the potential of the second output node N4 is a low voltage; the ninth transistor T9 is turned on, the tenth transistor T10 is turned off, and the output terminal OUT outputs the second high voltage provided by the second high voltage line VGHH.

In a fifth stage, the input terminal Input provides a low voltage, the second clock signal line CB provides a high voltage, the first clock signal line CK provides a low voltage, the first transistor T1 and the third transistor T3 are turned on, the potential of the first output node N1 becomes a low voltage, and the potential of the second node N2 is a low voltage; the eighth transistor T8 is turned on, and the potential of the second output node N4 becomes a high voltage; the ninth transistor T9 is turned off, the tenth transistor T10 is turned on, and the output terminal OUT outputs the second low voltage provided by the second low voltage line VGLL.

In a sixth stage, the input terminal Input provides a low voltage, the second clock signal line CB provides a low voltage, the first clock signal line CK provides a high voltage, the first transistor T1 and the third transistor T3 are turned off, the potential of the first output node N1 is maintained at a low voltage, the second transistor T2 is turned on, and the potential of the second node N2 becomes a high voltage; the eighth transistor T8 is turned on, and the potential of the second output node N4 becomes a high voltage; the ninth transistor T9 is turned off, the tenth transistor T10 is turned on, and the output terminal OUT outputs the second low voltage provided by the second low voltage line VGLL.

Figure 13:
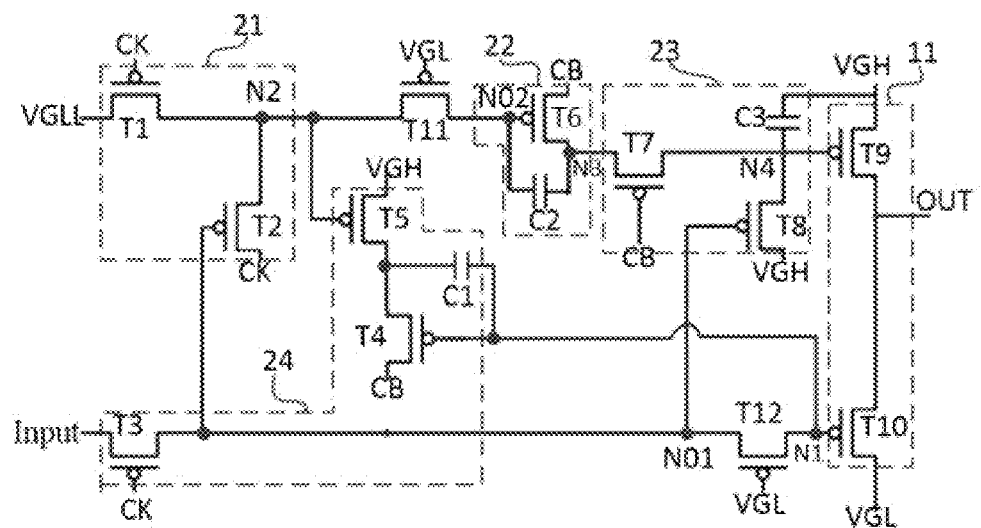
FIG. 13 is a circuit diagram of a shift register unit according to still yet another embodiment of the present application.

The difference between the embodiment of the shift register unit shown in FIG. 13 of the present application and the embodiment of the shift register unit shown in FIG. 4 of the present application is that: the shift register unit further includes a first isolation transistor T12 and a second isolation transistor T11.

A gate electrode of the second isolation transistor T11 is electrically coupled to the first low voltage line VGL. A gate electrode of the first isolation transistor T12 is electrically coupled to the first low voltage line VGL.

A gate electrode of the tenth transistor T10 is electrically coupled to the first output node N1. The gate electrode of the tenth transistor T10 is electrically coupled to the first isolation node N01 through the first isolation transistor T12. The gate electrode of the eighth transistor T8 is electrically coupled to the first isolation node N01. The drain electrode of the third transistor T3 is electrically coupled to the first isolation node N01. The gate electrode of the second transistor T2 is electrically coupled to the first isolation node N01.

A source electrode of the first isolation transistor T12 is electrically coupled to the first isolation node N01. A drain electrode of the first isolation transistor T12 is electrically coupled to the first output node N1.

The gate electrode of the sixth transistor T6 is electrically coupled to the second node N2 through the second isolation transistor T11. The gate electrode of the sixth transistor T6 is electrically coupled to the second isolation node N02.

A source electrode of the second isolation transistor T11 is electrically coupled to the second node N2. A drain electrode of the second isolation transistor T11 is electrically coupled to the second isolation node N02.

The difference between the embodiment of the shift register unit shown in FIG. 13 of the present application and the embodiment of the shift register unit shown in FIG. 4 of the present application further includes: the drain electrode of the fourth transistor T4 is electrically coupled to the second clock signal line CB, and the gate electrode of the fourth transistor T4 is electrically coupled to the first output node N1; and the second plate of the first capacitor C1 is electrically coupled to the source electrode of the fourth transistor T4.

In the embodiment of the shift register unit shown in FIG. 13, all the transistors are p-type thin film transistors, but not limited to this.

When the embodiment of the shift register unit shown in FIG. 13 of the present application is in operation, the presence of the first isolation transistor T12 enables the first isolation transistor T12 to be turned off when the potential of the first output node N1 is too low, so that the potential of the first isolation node N01 is not affected, thereby improving stability of the circuit.

The presence of the second isolation transistor T11 enables the second isolation transistor T1/ to be turned off when the potential of the second isolation node N02 is too low, so that the potential of the second node N2 is not affected, thereby improving stability of the circuit.

By changing connection relationship of the fourth transistor T4 and connection relationship of the second capacitor C2, when a high voltage signal is input by the input terminal Input and the potential of the first output node N1 is a high voltage, the fourth transistor T4 is turned off, so that the second plate of the second capacitor C2 will not communicate with the second clock signal terminal CB, and then the potential of the first output node N1 will not be affected by changing of the potential of the second clock signal. Meanwhile, when the potential of the first output node N1 is a low voltage, by turning on the fourth transistor T4, the second plate of the second capacitor C2 receives the second clock signal, and then the output terminal OUT can output a lower voltage when the potential of the second clock signal jumps from a high voltage to a low voltage.

Figure 14A:
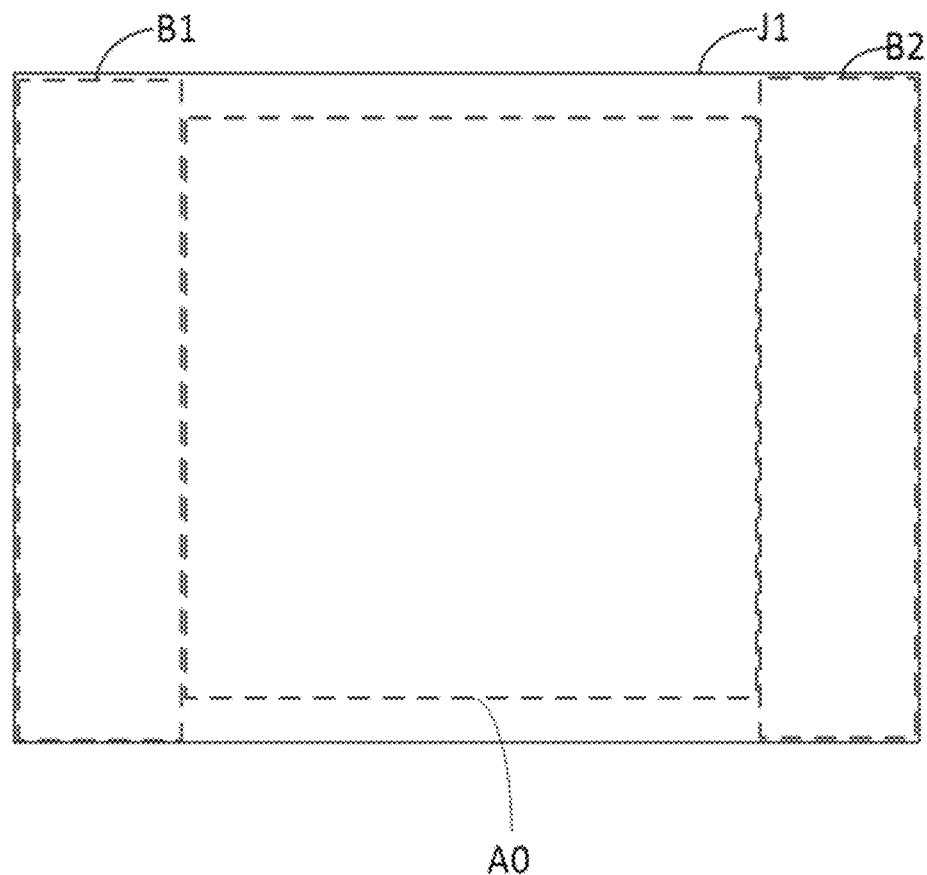
FIG. 14A is a schematic diagram showing region division of a display substrate according to at least one embodiment of the present application.

As shown in FIG. 14A, the reference number J1 represents a display substrate, the reference number A0 represents a display area, the reference number B1 represents a first edge area, and the reference number B2 represents a second edge area.

The display area A0 of the display substrate J1 may be provided with a plurality of light-emitting control lines, a plurality of gate lines, a plurality of data lines and a plurality of sub-pixels defined by crossing the plurality of gate lines and the plurality of data lines.

A scanning driving circuit may be provided in the first edge area B1 and/or the second edge area B2. The scanning driving circuit includes a plurality of shift register units described in at least one embodiment of the present application.

The plurality of shift register units included in the scanning driving circuit are corresponding to the plurality of light-emitting control lines in a one-to-one manner. Each shift register unit is coupled to the corresponding light-emitting control line, and is configured to provide a light-emitting control signal for the corresponding light-emitting control line.

In one specific implementation, one light-emitting control line is coupled to a light-emitting control terminal of a corresponding row of pixel circuits.

Optionally, the display substrate further includes a plurality of rows of pixel circuits arranged on the display substrate. The pixel circuit includes a light-emitting control terminal.

The shift register units included in the scanning driving circuit are corresponding to the row of pixel circuits in a one-to-one manner.

A signal output line of the shift register unit is coupled to the light-emitting control terminal of the corresponding row of pixel circuits, and is configured to provide a light-emitting control signal for the light-emitting control terminal of the corresponding row of pixel circuits.

In at least one embodiment of the present application, the pixel circuits may be disposed in an active display area of the display substrate, and the scanning driving circuit may be disposed in the edge area of the display substrate.

Figure 14B:
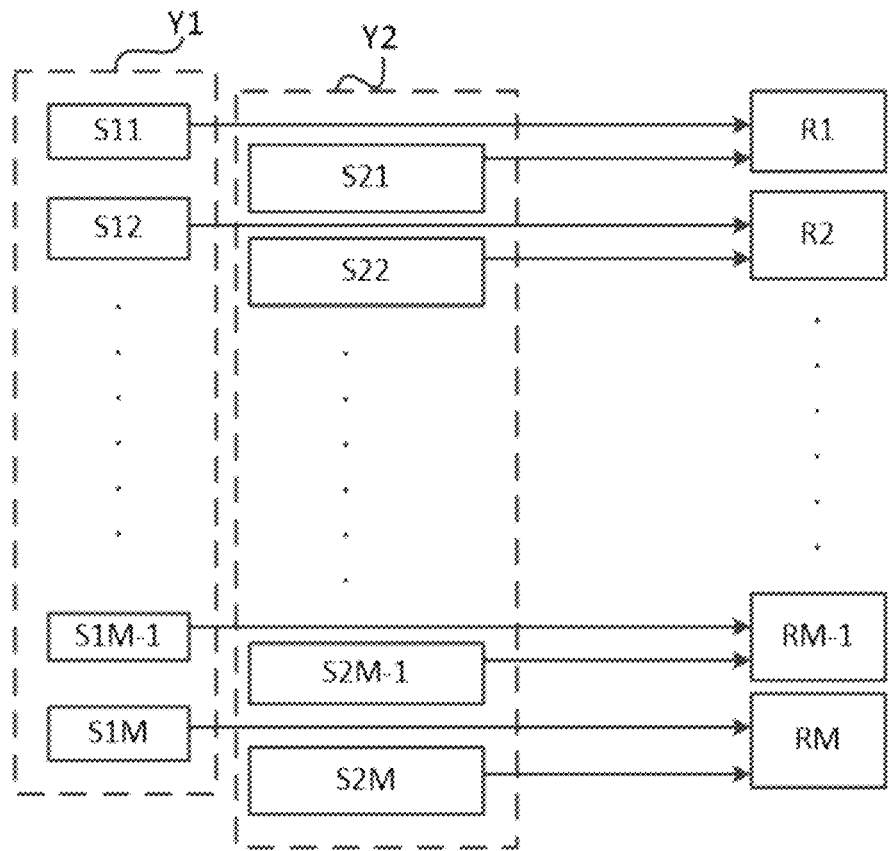
FIG. 14B is a schematic diagram showing connection relationship between a scanning driving circuit and a pixel circuit included in the display substrate according to at least one embodiment of the present application.

As shown in FIG. 14B, the reference number Y1 represents a scanning driving circuit; the reference number S11 represents a first-stage shift register unit included in a scanning driving circuit Y1; the reference number S12 represents a second-stage shift register unit included in the scanning driving circuit Y1; the reference number SIM−1 represents a (M−1)-th stage shift register unit included in the scanning driving circuit Y1; and the reference number S1M represents an M-th stage shift register unit included in the scanning driving circuit S1, where M is an integer greater than 3.

In FIG. 14B, the reference number R1 represents a first row of pixel circuits; the reference number R2 represents a second row of pixel circuits; the reference number RM−1 represents a (M−1)-th row of pixel circuits; and the reference number RM represents an M-th row of pixel circuits.

The first-stage shift register unit S11 included in the scanning driving circuit Y1 is corresponding to the first row R1 of pixel circuits. The second-stage shift register unit S12 included in the scanning driving circuit Y1 is corresponding to the second row R2 of pixel circuits. The (M−1)-th stage shift register unit S1M−1 included in the scanning driving circuit Y1 is corresponding to the (M−1)-th row RM−1 of pixel circuits. The M-th stage shift register unit S1M included in the scanning driving circuit Y1 is corresponding to the M-th row RM of pixel circuits.

The first-stage shift register unit S11 included in the scanning driving circuit Y1 provides a first row light-emitting control signal for the first row R1 of pixel circuits. The second-stage shift register unit S12 included in the scanning driving circuit Y1 provides a second row light-emitting control signal for the second row R2 of pixel circuits. The (M−1)-th stage shift register unit SIM−1 included in the scanning driving circuit Y1 provides a (M−1)-th row light-emitting control signal for the (M−1)-th row RM−1 of pixel circuits. The M-th stage shift register unit S1M included in the scanning driving circuit Y1 provides an M-th row light-emitting control signal for the M-th row RM of pixel circuits.

As shown in FIG. 14B, a gate driving circuit may further be provided in the edge area of the display substrate. The gate driving circuit includes multiple stages of gate driving units. The gate driving units are corresponding to the rows of pixels in a one-to-one manner, and are configured to provide corresponding gate driving signals for corresponding rows of pixels.

In FIG. 14B, the reference number Y2 represents a gate driving circuit; the reference number S21 represents a first row of gate driving units included in the gate driving circuit; the reference number S22 represents a second row of gate driving units included in the gate driving circuit; the reference number S2M−1 represents a (M−1)-th row of gate driving units included in the gate driving circuit; and the reference number S2M represents an M-th row of gate driving units included in the gate driving circuit.

Figure 14C:
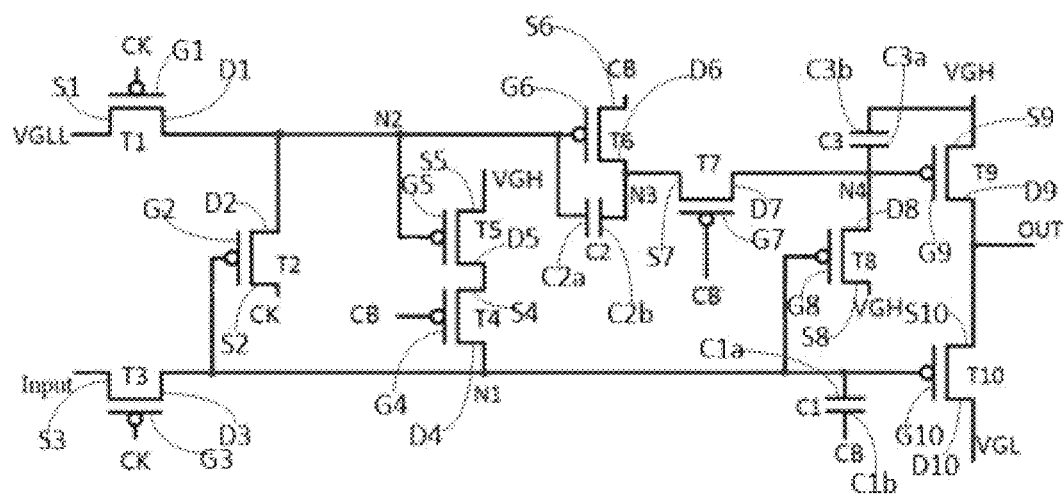
FIG. 14C is a schematic diagram showing the shift register unit shown in FIG. 4 with addition of reference numerals for electrodes of various transistors and reference numerals for plates of various capacitors according to an embodiment of the present application.

As shown in FIG. 14C, on the basis of the embodiment of the shift register unit shown in FIG. 4, the reference numbers for electrodes of various transistors and the reference numbers for plates of various capacitors are added.

In FIG. 14C, the reference number G1 represents a gate electrode of the first transistor T1; the reference number S1 represents a source electrode of the first transistor T1; the reference number D1 represents a drain electrode of the first transistor T1; the reference number G2 represents a gate electrode of the second transistor T2; the reference number S2 represents a source electrode of the second transistor T2; the reference number D2 represents a drain electrode of the second transistor T2; the reference number G3 represents a gate electrode of the third transistor T3; the reference number S3 represents a source electrode of the third transistor T3; the reference number D3 represents a drain electrode of the third transistor T3; the reference number G4 represents a gate electrode of the fourth transistor T4; the reference number S4 represents a source electrode of the fourth transistor T4; the reference number D4 represents a drain electrode of the fourth transistor T4; the reference number G5 represents a gate electrode of the fifth transistor T5; the reference number S5 represents a source electrode of the fifth transistor T5; the reference number D5 represents a drain electrode of the fifth transistor T5; the reference number G6 represents a gate electrode of the sixth transistor T6; the reference number S6 represents a source electrode of the sixth transistor T6; the reference number D6 represents a drain electrode of the sixth transistor T6; the reference number G7 represents a gate electrode of the seventh transistor T7; the reference number S7 represents a source electrode of the seventh transistor T7; the reference number D7 represents a drain electrode of the seventh transistor T7; the reference number G8 represents a gate electrode of the eighth transistor T8; the reference number S8 represents a source electrode of the eighth transistor T8; the reference number D8 represents a drain electrode of the eighth transistor T8; the reference number G9 represents a gate electrode of the ninth transistor T9; the reference number S9 represents a source electrode of the ninth transistor T9; the reference number D9 represents a drain electrode of the ninth transistor T9; the reference number G10 represents a gate electrode of the tenth transistor T10; the reference number S10 represents a source electrode of the tenth transistor T10; the reference number D10 represents a drain electrode of the tenth transistor T10; the reference number C1a represents a first plate of the first capacitor C1; the reference number C1b represents a second plate of the first capacitor C1; the reference number C2a represents a first plate of the second capacitor C2; the reference number C2b represents a second plate of the second capacitor C2; the reference number C3a represents a first plate of the third capacitor C3; and the reference number C3b represents a second plate of the third capacitor C3.

As shown in FIG. 14C to FIG. 20, the source electrode S1 of the first transistor T1 is electrically coupled to the second low voltage line VGLL.

As shown in FIG. 15 to FIG. 20, the source electrode S1 of the first transistor T1 is electrically coupled to a connection conductive portion LO through a first via-hole H1. The connection conductive portion LO is electrically coupled to the second low voltage line VGLL, so that the source electrode S1 of the first transistor T1 is electrically coupled to the second low voltage line VGLL. The drain electrode D10 of the tenth transistor T10 is electrically coupled to the first low voltage line VGL.

By adopting the layout of the shift register unit shown in FIG. 15 to FIG. 20, the first low voltage line VGL electrically coupled to the drain electrode D10 of the tenth transistor T10, is only used for output, does not need to provide the first low voltage to the source electrode S3 of the third transistor T3, is not interfered by other transistors, and has simple wiring.

Figure 16:
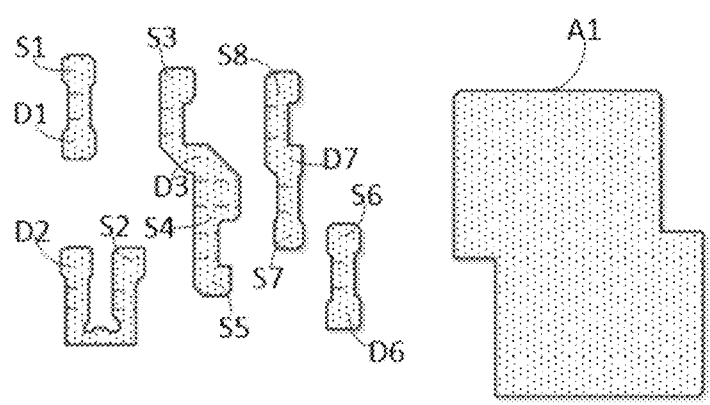
FIG. 16 is a schematic diagram of an active layer in FIG. 20.

In FIG. 16, the reference number A1 represents a first active pattern; the reference number S1 represents a source electrode of the first transistor T1; the reference number D1 represents a drain electrode of the first transistor T1; the reference number S2 represents a source electrode of the second transistor T2; the reference number D2 represents a drain electrode of the second transistor T2; the reference number S3 represents a source electrode of the third transistor T3; the reference number D3 represents a drain electrode of the third transistor T3; the reference number S4 represents a source electrode of the fourth transistor T4; the reference number S5 represents a source electrode of the fifth transistor T5; the reference number S6 represents a source electrode of the sixth transistor T6; the reference number D6 represents a drain electrode of the sixth transistor T6; the reference number S7 represents a source electrode of the seventh transistor T7; the reference number D7 represents a drain electrode of the seventh transistor T7; the reference number S8 represents a source electrode of the eighth transistor T8.

In the embodiment corresponding to FIG. 15 to FIG. 20, the drain electrode D7 of the seventh transistor T7 is reused as the drain electrode of the eighth transistor T8; the drain electrode D3 of the third transistor T3 is reused as the drain electrode of the fourth transistor T4; the source electrode S4 of the fourth transistor T4 is reused as the drain electrode of the fifth transistor T5; and the reference number G2 represents a double-gate transistor, but not limited to this.

Figure 17:
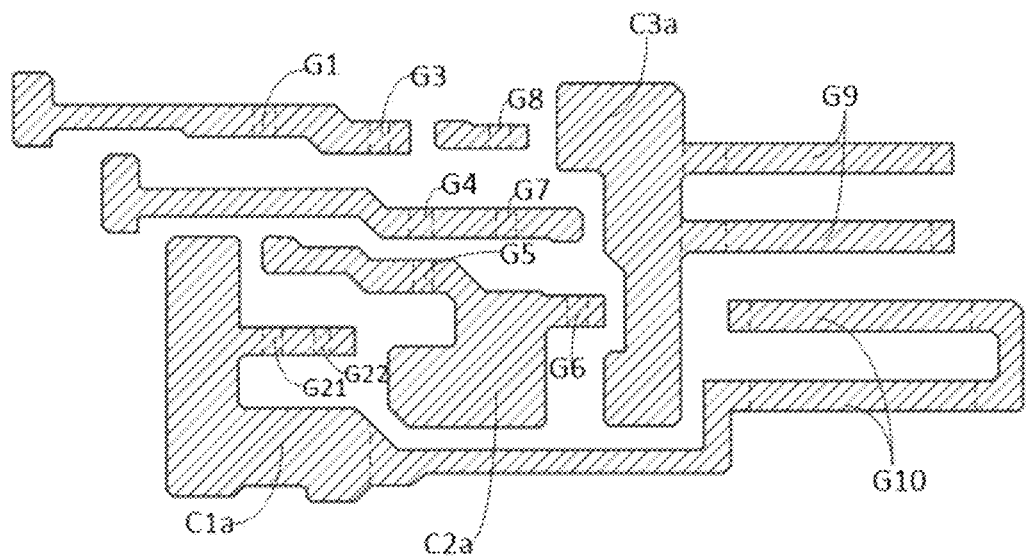
FIG. 17 is a schematic diagram of a first gate metal layer in FIG. 20.

In FIG. 17, the reference number G1 represents a gate electrode of the first transistor T1; the reference number G21 represents a first gate pattern included in the gate electrode of the second transistor T2; the reference number G22 represents a second gate pattern included in the gate electrode of the second transistor T2; the reference number G3 represents a gate electrode of the third transistor T3; the reference number G4 represents a gate electrode of the fourth transistor T4; the reference number G5 represents a gate electrode of the fifth transistor T5; the reference number G6 represents a gate electrode of the sixth transistor T6; the reference number G7 represents a gate electrode of the seventh transistor T7; the reference number G8 represents a gate electrode of the eighth transistor T8; the reference number G9 represents a gate electrode of the ninth transistor T9; the reference number G10 represents a gate electrode of the tenth transistor T10; the reference number C1a represents a first plate of the first capacitor C1; the reference number C2a represents a first plate of the second capacitor C2, and the reference number C3a represents a first plate of the third capacitor C3.

Figure 18:
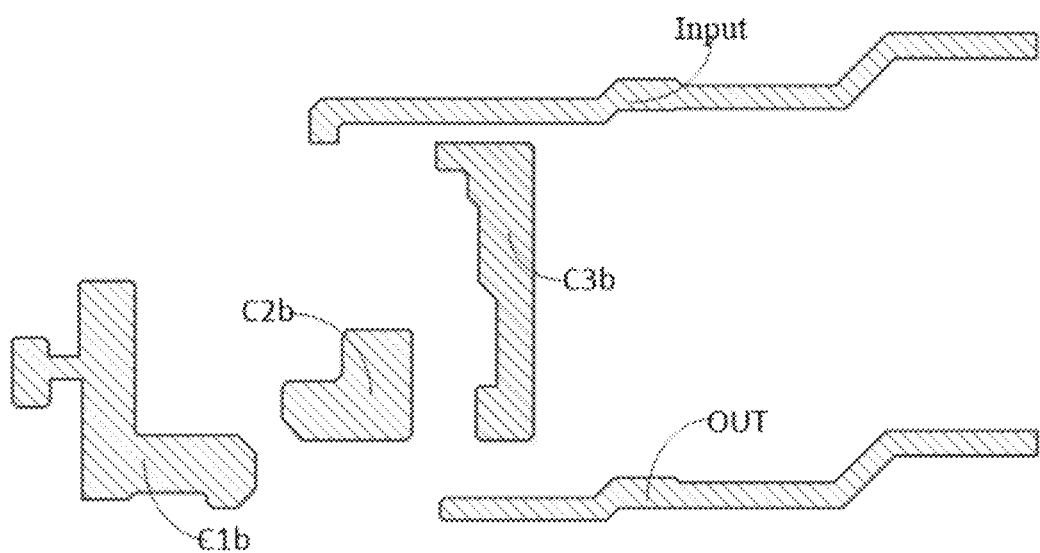
FIG. 18 is a schematic diagram of a second gate metal layer in FIG. 20.

In FIG. 18, the reference number Input represents an input terminal; the reference number OUT represents an output terminal; the reference number C1b represents a second plate of the first capacitor C1; the reference number C2b represents a second plate of the second capacitor C2; the reference number C3b represents a second plate of the third capacitor C3.

Figure 15:
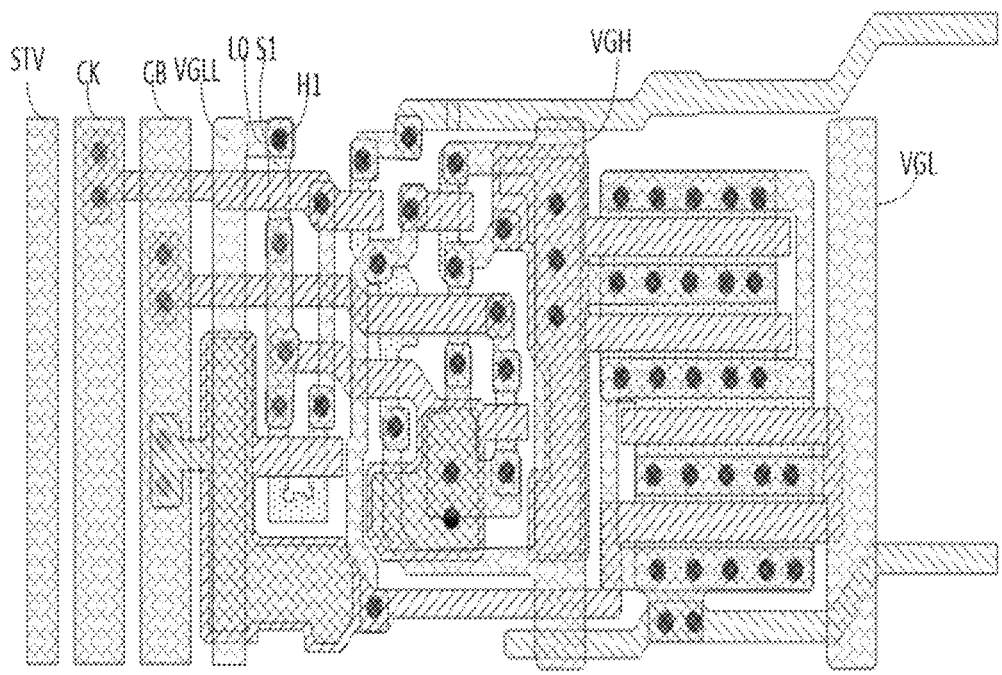
FIG. 15 is a schematic diagram of a layout of the shift register unit shown in FIG. 14C according to an embodiment of the present application.
Figure 19:
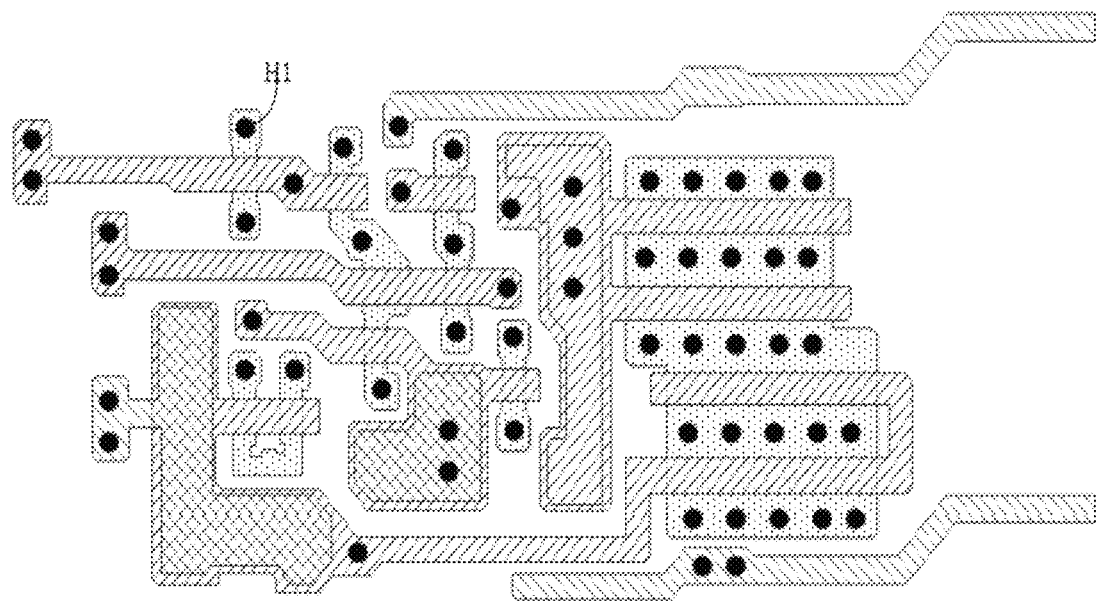
FIG. 19 is a schematic diagram of a via-hole in FIG. 20.

In FIG. 15 and FIG. 19, the reference number H1 represents a first via-hole.

Figure 20:
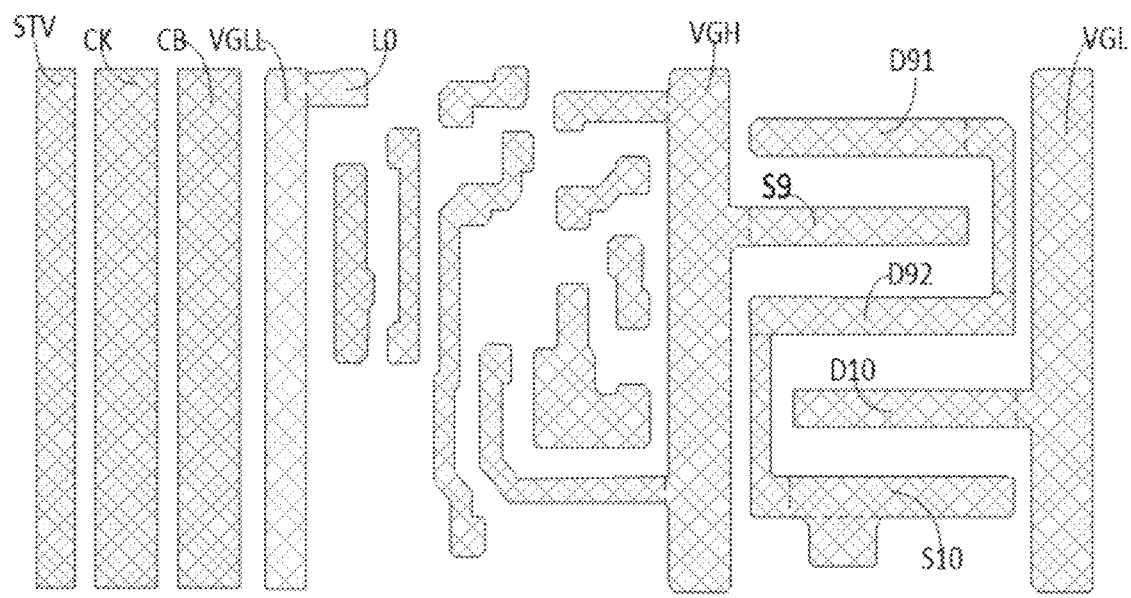
FIG. 20 is a schematic diagram of a source-drain metal layer in FIG. 20.

In FIG. 15 and FIG. 20, the reference number STV represents a start signal line; the reference number CK represents a first clock signal line; the reference number CB represents a second clock signal line; the reference number VGLL represents a second low voltage line; the reference number VGH represents a first high voltage line; the reference number VGL represents a first low voltage line; the reference number D91 represents a first electrode pattern included in the drain electrode of the ninth transistor T9; the reference number D92 represents a second electrode pattern included in the drain electrode of the ninth transistor T9; the reference number D10 represents a drain electrode of the tenth transistor T10; the reference number S9 represents a source electrode of the ninth transistor T9; the reference number S10 represents a source electrode of the tenth transistor T10; and the reference number LO represents a connection conductive portion.

In FIG. 15, the reference number S1 represents a source electrode of the first transistor T.

In the embodiment of the shift register unit shown in FIG. 14C to FIG. 20, the first voltage line, the fourth voltage line and the fifth voltage line are all first high voltage lines VGH, the second voltage line is a first low voltage line VGL, and the third voltage line is a second low voltage line VGLL.

As shown in FIG. 15 to FIG. 20, the second low voltage line VGLL is located at one side of the first low voltage line VGL away from the display area; and the first high voltage line VGH is located between the first low voltage line VGL and the second low voltage line VGLL. An orthographic projection of the first high voltage line VGH onto a base substrate at least partially overlaps an orthographic projection of the shift register unit onto the base substrate.

The first clock signal line CK and the second clock signal line CB are located at one side of the second low voltage line VGLL away from the display area. The first clock signal line CK and the second clock signal line CB are arranged side by side and next to each other.

The shift register unit is located between the first clock signal line CK and the first low voltage line VGL.

The output circuit in the shift register unit is located between the first low voltage line VGL and the first high voltage line VGH.

In one specific implementation, in the embodiment shown in FIG. 14C to FIG. 20, positions of the first clock signal line CK and the second clock signal line CB may also be interchanged.

In the embodiment shown in FIG. 14C to FIG. 20, each of the first high voltage line VGH, the first low voltage line VGL, the second low voltage line VGLL, the first clock signal line CK and the second clock signal line CB extends along a vertical direction, which is not limited to this.

In the embodiments shown in FIG. 14C to FIG. 20, the ninth transistor T9 and the tenth transistor T10 included in the output circuit may be located between the high voltage line VGH and the low voltage line VGL.

In the embodiments shown in FIG. 14C to FIG. 20, since the ninth transistor T9 is electrically coupled to the first high voltage line VGH and the tenth transistor T10 is electrically coupled to the first low voltage line VGL, the ninth transistor T9 and the tenth transistor T10 are arranged between the first high voltage line VGH and the first low voltage line VGL. Further, the output terminal OUT is arranged in a space between the tenth transistors included in the shift register units which are adjacent in a longitudinal direction. In this way, the ninth transistor T9 and the tenth transistor T10 are arranged between the first high voltage line VGH and the first low voltage line VGL, there is no other signal line or component included in other transistor between the first high voltage line VGH and the output circuit (which includes the ninth transistor T9 and the tenth transistor T10), and there is no other signal line or component included in other transistor between the first low voltage line VGL and the output circuit, thereby reducing a distance from the first high voltage line VGH to the ninth transistor T9 and the tenth transistor T10, reducing a distance from the first low voltage line VGL to the ninth transistor T9 and the tenth transistor T10, and then reducing a horizontal width of the shift register unit.

Figure 21:
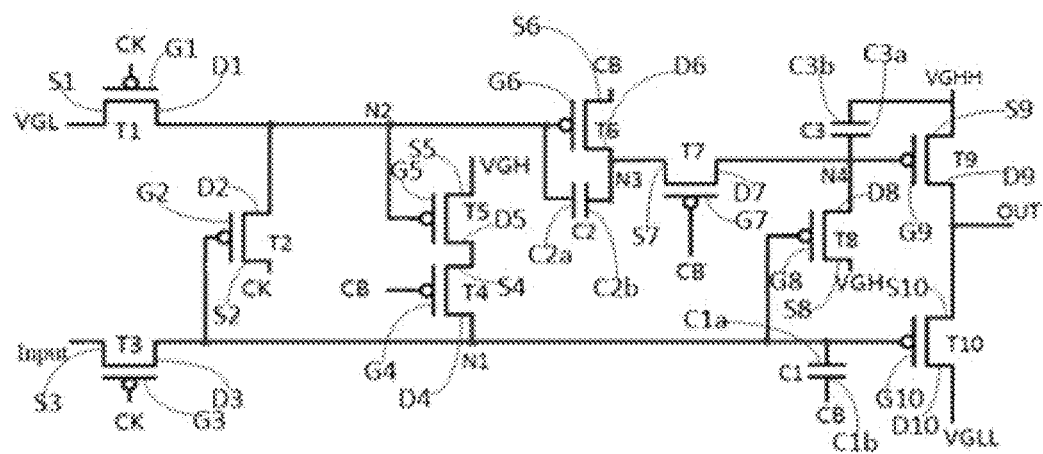
FIG. 21 is a schematic diagram showing the shift register unit shown in FIG. 12 with addition of reference numerals for electrodes of various transistors and reference numerals for plates of various capacitors according to an embodiment of the present application.

As shown in FIG. 21, on the basis of the embodiment of the shift register unit shown in FIG. 12, the reference numbers for electrodes of various transistors and the reference numbers for plates of various capacitors are added.

In FIG. 21, the reference number G1 represents a gate electrode of the first transistor T1; the reference number S1 represents a source electrode of the first transistor T1; the reference number D1 represents a drain electrode of the first transistor T1; the reference number G2 represents a gate electrode of the second transistor T2; the reference number S2 represents a source electrode of the second transistor T2; the reference number D2 represents a drain electrode of the second transistor T2; the reference number G3 represents a gate electrode of the third transistor T3; the reference number S3 represents a source electrode of the third transistor T3; the reference number D3 represents a drain electrode of the third transistor T3; the reference number G4 represents a gate electrode of the fourth transistor T4; the reference number S4 represents a source electrode of the fourth transistor T4; the reference number D4 represents a drain electrode of the fourth transistor T4; the reference number G5 represents a gate electrode of the fifth transistor T5; the reference number S5 represents a source electrode of the fifth transistor T5; the reference number D5 represents a drain electrode of the fifth transistor T5; the reference number G6 represents a gate electrode of the sixth transistor T6; the reference number S6 represents a source electrode of the sixth transistor T6; the reference number D6 represents a drain electrode of the sixth transistor T6; the reference number G7 represents a gate electrode of the seventh transistor T7; the reference number S7 represents a source electrode of the seventh transistor T7; the reference number D7 represents a drain electrode of the seventh transistor T7; the reference number G8 represents a gate electrode of the eighth transistor T8; the reference number S8 represents a source electrode of the eighth transistor T8; the reference number D8 represents a drain electrode of the eighth transistor T8; the reference number G9 represents a gate electrode of the ninth transistor T9; the reference number S9 represents a source electrode of the ninth transistor T9; the reference number D9 represents a drain electrode of the ninth transistor T9; the reference number G10 represents a gate electrode of the tenth transistor T10; the reference number S10 represents a source electrode of the tenth transistor T10; the reference number D10 represents a drain electrode of the tenth transistor T10; the reference number C1a represents a first plate of the first capacitor C1; the reference number C1b represents a second plate of the first capacitor C1; the reference number C2a represents a first plate of the second capacitor C2; the reference number C2b represents a second plate of the second capacitor C2; the reference number C3*a* represents a first plate of the third capacitor C3; and the reference number C3*b* represents a second plate of the third capacitor C3.

Figure 27:
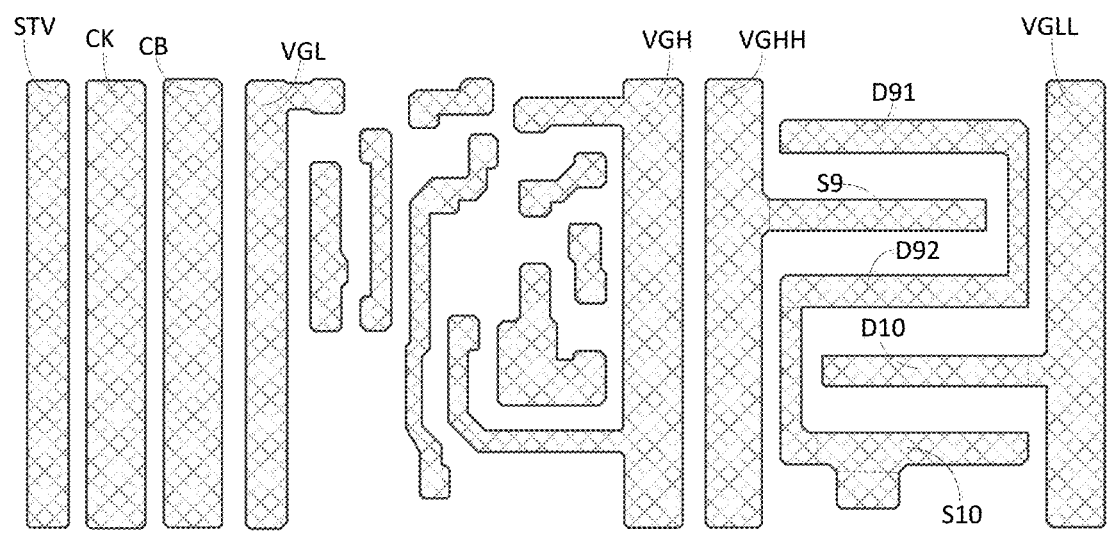
FIG. 27 is a schematic diagram of a source-drain metal layer in FIG. 22.

As shown in FIG. 27, the source electrode S9 of the ninth transistor T9 is electrically coupled to the second high voltage line VGHH, and the drain electrode D10 of the tenth transistor T10 is electrically coupled to the second low voltage line VGLL.

By adopting the layout of the shift register unit shown in FIG. 22 to FIG. 27, the second high voltage line VGHH electrically coupled to the ninth transistor T9 is only used for output, the second low voltage line VGLL electrically coupled to the tenth transistor T10 is also only used for output, the second high voltage line VGHH is not electrically coupled to other transistors except for the ninth transistor T9, and the second low voltage line VGLL is not electrically coupled to other transistors except for the tenth transistor T10. In this way, the second high voltage line VGHH and the second low voltage line VGLL are not interfered by other transistors, thereby ensuring stability of an output light-emitting control signal.

Figure 23:
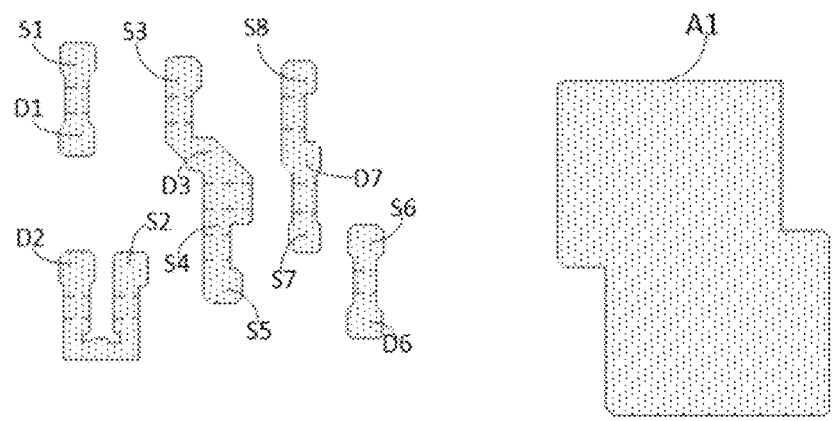
FIG. 23 is a schematic diagram of an active layer in FIG. 22.

In FIG. 23, the reference number A1 represents a first active pattern; the reference number S1 represents a source electrode of the first transistor T1; the reference number D1 represents a drain electrode of the first transistor T1; the reference number S2 represents a source electrode of the second transistor T2; the reference number D2 represents a drain electrode of the second transistor T2; the reference number S3 represents a source electrode of the third transistor T3; the reference number D3 represents a drain electrode of the third transistor T3; the reference number S4 represents a source electrode of the fourth transistor T4; the reference number S5 represents a source electrode of the fifth transistor T5; the reference number S6 represents a source electrode of the sixth transistor T6; the reference number D6 represents a drain electrode of the sixth transistor T6; the reference number S7 represents a source electrode of the seventh transistor T7; the reference number D7 represents a drain electrode of the seventh transistor T7; the reference number S8 represents a source electrode of the eighth transistor T8.

In the embodiment corresponding to FIG. 22 to FIG. 27, the drain electrode D7 of the seventh transistor T7 is reused as the drain electrode of the eighth transistor T8; the drain electrode D3 of the third transistor T3 is reused as the drain electrode of the fourth transistor T4; the source electrode S4 of the fourth transistor T4 is reused as the drain electrode of the fifth transistor T5; and the reference number G2 represents a double-gate transistor, but not limited to this.

Figure 24:
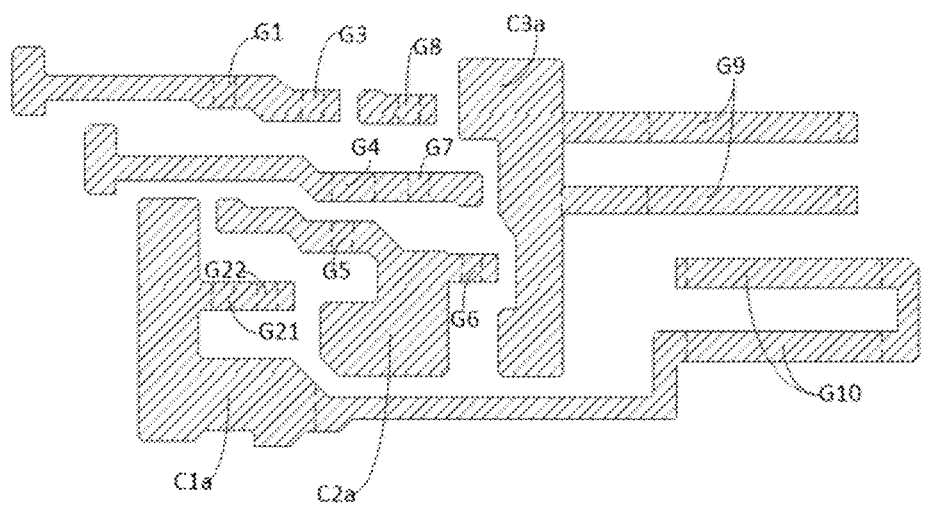
FIG. 24 is a schematic diagram of a first gate metal layer in FIG. 22.

In FIG. 24, the reference number G1 represents a gate electrode of the first transistor T1; the reference number G21 represents a first gate pattern included in the gate electrode of the second transistor T2; the reference number G22 represents a second gate pattern included in the gate electrode of the second transistor T2; the reference number G3 represents a gate electrode of the third transistor T3; the reference number G4 represents a gate electrode of the fourth transistor T4; the reference number G5 represents a gate electrode of the fifth transistor T5; the reference number G6 represents a gate electrode of the sixth transistor T6; the reference number G7 represents a gate electrode of the seventh transistor T7; the reference number G8 represents a gate electrode of the eighth transistor T8; the reference number G9 represents a gate electrode of the ninth transistor T9; the reference number G10 represents a gate electrode of the tenth transistor T10; the reference number C1*a* represents a first plate of the first capacitor C1; the reference number C2*a* represents a first plate of the second capacitor C2, and the reference number C3*a* represents a first plate of the third capacitor C3.

Figure 25:
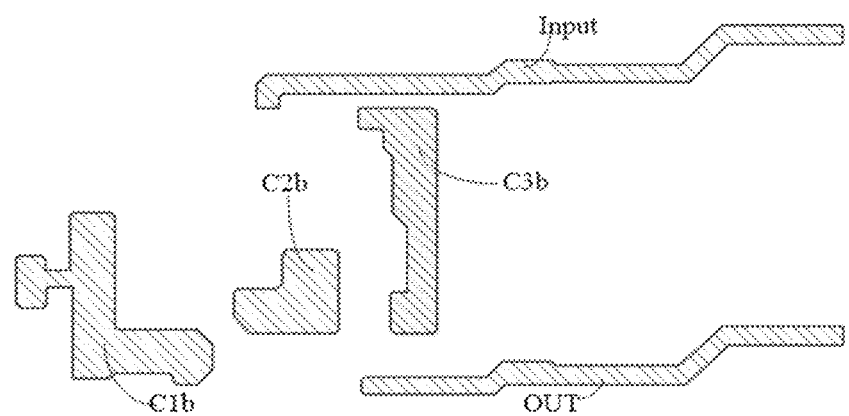
FIG. 25 is a schematic diagram of a second gate metal layer in FIG. 22.
Figure 26:
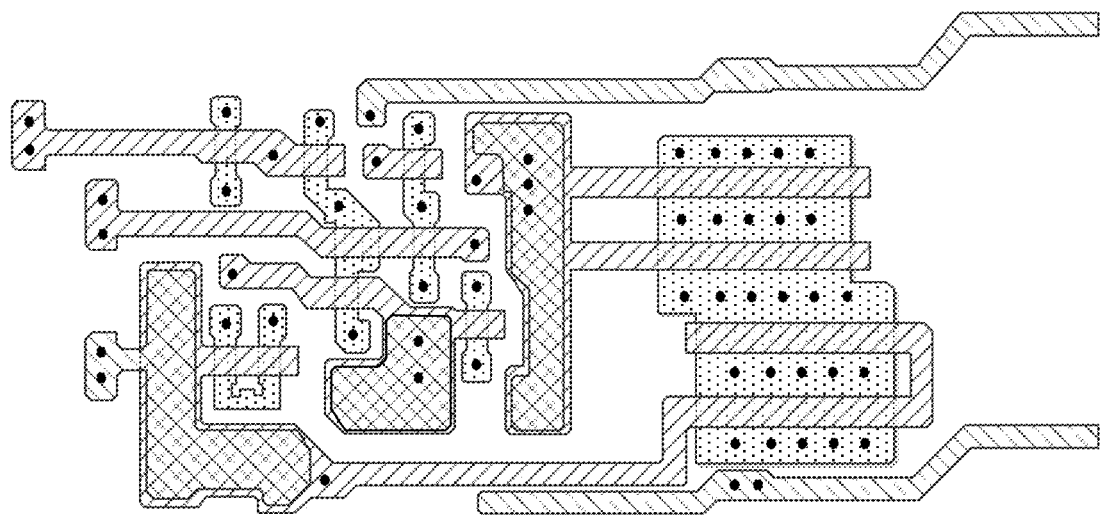
FIG. 26 is a schematic diagram of a via-hole in FIG. 22.

In FIG. 25, the reference number Input represents an input terminal; the reference number OUT represents an output terminal; the reference number C1*b* represents a second plate of the first capacitor C1; the reference number C2*b* represents a second plate of the second capacitor C2; the reference number C3*b* represents a second plate of the third capacitor C3.

In FIG. 27, the reference number D91 represents a first electrode pattern included in the drain electrode of the ninth transistor T9; the reference number D92 represents a second electrode pattern included in the drain electrode of the ninth transistor T9; the reference number D10 represents a drain electrode of the tenth transistor T10; the reference number S9 represents a source electrode of the ninth transistor T9; and the reference number S10 represents a source electrode of the tenth transistor T10.

Figure 22:
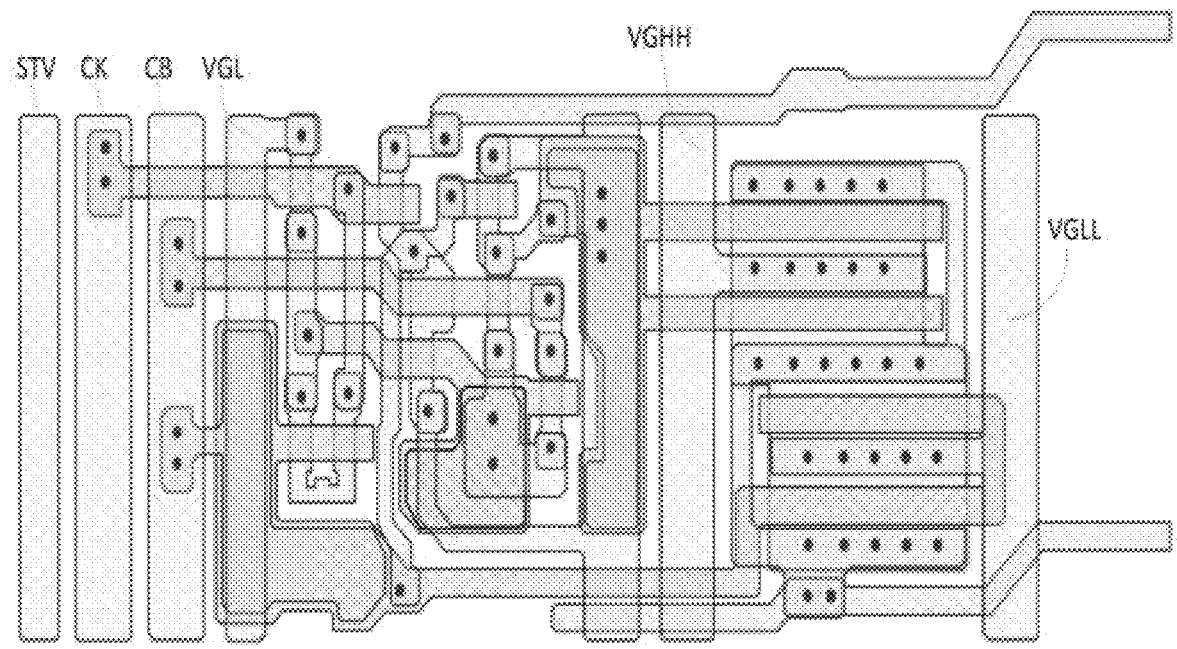
FIG. 22 is a schematic diagram of a layout of the shift register unit shown in FIG. 21 according to an embodiment of the present application.

In FIG. 22 and FIG. 27, the reference number STV represents a start signal line; the reference number CK represents a first clock signal line; the reference number CB represents a second clock signal line; the reference number VGHH represents a second high voltage line; the reference number VGLL represents a second low voltage line; the reference number VGH represents a first high voltage line; and the reference number VGL represents a first low voltage line.

In the embodiment of the shift register unit shown in FIG. 21 to FIG. 27, the third voltage line is a first low voltage line; the fourth voltage line and the fifth voltage line are first high voltage lines; the first voltage line is a second high voltage line; and the second voltage line is a second low voltage line.

As shown in FIG. 22 to FIG. 27, the first low voltage line VGL is located at one side of the second low voltage line VGLL away from the display area; and the first high voltage line VGH and the second high voltage line VGHH are located between the first low voltage line VGL and the second low voltage line VGLL.

An orthographic projection of the first high voltage line VGH onto a base substrate at least partially overlaps an orthographic projection of the shift register unit onto the base substrate. An orthographic projection of the second high voltage line VGHH onto the base substrate at least partially overlaps the orthographic projection of the shift register unit onto the base substrate.

The first high voltage line VGH is located at one side of the second high voltage line VGHH away from the second low voltage line; and the first high voltage line VGH and the second high voltage line VGHH are arranged side by side and adjacent to each other.

The first clock signal line CK and the second clock signal line CB are located at one side of the first low voltage line VGL away from the display area. The first clock signal line CK and the second clock signal line CB are arranged side by side and next to each other. The shift register unit is located between the first clock signal line CK and the second low voltage line VGLL.

In the embodiment shown in FIG. 21 to FIG. 27, each of the first high voltage line VGH, the second high voltage line VGHH, the first low voltage line VGL, the second low voltage line VGLL, the first clock signal line CK and the second clock signal line CB extends along a vertical direction, which is not limited to this.

In the embodiment of the shift register unit shown in FIG. 21 to FIG. 27, the output circuit in the shift register unit is located between the second low voltage line VGLL and the second high voltage line VGHH. Since the ninth transistor T9 is electrically coupled to the second high voltage line VGHH and the tenth transistor T10 is electrically coupled to the second low voltage line VGLL, the ninth transistor T9 and the tenth transistor T10 are arranged between the second low voltage line VGLL and the second high voltage line VGHH. Further, the output terminal OUT is arranged in a space between the tenth transistors included in the shift register units which are adjacent in a longitudinal direction. In this way, the ninth transistor T9 and the tenth transistor T10 are arranged between the second low voltage line VGLL and the second high voltage line VGHH, there is no other signal line or component included in other transistor between the second high voltage line VGHH and the output circuit (which includes the ninth transistor T9 and the tenth transistor T10), and there is no other signal line or component included in other transistor between the second low voltage line VGLL and the output circuit, thereby reducing a distance from the second high voltage line VGHH to the ninth transistor T9 and the tenth transistor T10, reducing a distance from the second low voltage line VGLL to the ninth transistor T9 and the tenth transistor T10, and then reducing a horizontal width of the shift register unit.

The display substrate according to the embodiment of the present application includes a base substrate, a scanning driving circuit and a display area on the base substrate. The scanning driving circuit is disposed at an edge area of the base substrate. The scanning driving circuit includes a plurality of foregoing shift register units. The scanning driving circuit further includes a first voltage line, a second voltage line, a third voltage line, a fourth voltage line, a fifth voltage line, a first clock signal line, and a second clock signal line. Each of the first voltage line, the second voltage line, the third voltage line, the fourth voltage line, the fifth voltage line, the first clock signal line, and the second clock signal line extends along a first direction.

There is at least one driving transistor in the display area. The driving transistor is configured to drive a light-emitting element for display.

In the display substrate according to the embodiment of the present application, the scanning driving circuit may be disposed at the edge area of the base substrate; the scanning driving circuit further includes a first voltage line, a second voltage line, a third voltage line, a fourth voltage line, a fifth voltage line, a first clock signal line and a second clock signal line, and each of the first voltage line, the second voltage line, the third voltage line, the fourth voltage line, the fifth voltage line, the first clock signal line, and the second clock signal line extends along a first direction. The first direction may be a direction in which the data line extends (in FIG. 20 and FIG. 27, the first direction may be the vertical direction), but is not limited to this.

Optionally, the first voltage line, the fourth voltage line and the fifth voltage line are all a first high voltage line, the second voltage line is a first low voltage line, and the third voltage line is a second low voltage line.

The second low voltage line is located at one side of the first low voltage line away from the display area; and the first high voltage line is located between the first low voltage line and the second low voltage line. An orthographic projection of the first high voltage line onto the base substrate at least partially overlaps an orthographic projection of the shift register unit onto the base substrate.

In at least one embodiment of the present application, the first voltage line, the fourth voltage line and the fifth voltage line may be an identical voltage line; and the first high voltage line is arranged between the first low voltage line and the second low voltage line, so that various transistors and capacitors included in the shift register unit can be easily and electrically coupled to various voltage lines.

In one specific implementation, the first clock signal line and the second clock signal line are arranged at one side of the second low voltage line away from the display area.

The shift register unit is located between the first clock signal line and the first low voltage line.

The output circuit in the shift register unit is located between the first low voltage line and the first high voltage line.

Optionally, the first voltage line is a second high voltage line; the second voltage line is a second low voltage line; the third voltage line is a first low voltage line; and the fourth voltage line and the fifth voltage lines are a first high voltage line.

The first low voltage line is located at one side of the second low voltage line away from the display area. The first high voltage line and the second high voltage line are located between the first low voltage line and the second low voltage line.

In at least one embodiment of the present application, the fourth voltage line and the fifth voltage line may be an identical voltage line; the first high voltage line and the second high voltage line are located between the first low voltage line and the second low voltage line, so that various transistors and various capacitors included in the shift register unit can be easily and electrically coupled to various voltage lines.

In one specific implementation, an orthographic projection of the first high voltage line onto the base substrate at least partially overlaps an orthographic projection of the shift register unit onto the base substrate. An orthographic projection of the second high voltage line onto the base substrate at least partially overlaps the orthographic projection of the shift register unit onto the base substrate.

The first high voltage line is located at one side of the second high voltage line away from the second low voltage line.

In at least one embodiment of the present application, the output circuit in the shift register unit is located between the second low voltage line and the second high voltage line.

The first clock signal line and the second clock signal line are arranged at one side of the first low voltage line away from the display area; and the shift register unit is located between the first clock signal line and the second low voltage line.

The scanning driving circuit in the embodiment of the present application includes multiple stages of the foregoing shift register units.

A display device in the embodiment of the present application includes the foregoing scanning driving circuit.

The display device provided in the embodiment of the present application may be any product or component with a display function, such as a mobile phone, a tablet computer, a television, a monitor, a notebook computer, a digital photo frame, and a navigator.

The above descriptions are merely some embodiments of the present disclosure. It should be noted that for those of ordinary skill in the art, without departing from the principles of the present disclosure, various improvements and modifications can be made. These improvements and modifications should fall within the protection scope of the present disclosure.

What is claimed is:

1. A shift register unit, comprising:
   an output terminal;

an output circuit; and an output node control circuit;

wherein the output circuit is electrically coupled to a first output node, a second output node, a first voltage line, a second voltage line, and the output terminal, respectively; the output circuit is configured to, write a second voltage signal provided by the second voltage line into the output terminal under control of a potential of the first output node, and write a first voltage signal provided by the first voltage line into the output terminal under control of a potential of the second output node;

the output node control circuit is electrically coupled to the first output node, the second output node, a third voltage line, a fourth voltage line, a fifth voltage line, a first clock signal line, a second clock signal line, and an input terminal, respectively; the output node control circuit is configured to control the potential of the first output node and the potential of the second output node, according to a third voltage signal provided by the third voltage line, a fourth voltage signal provided by the fourth voltage line, a fifth voltage signal provided by the fifth voltage line, a first clock signal provided by the first clock signal line, a second clock signal provided by the second clock signal line and an input signal provided by the input terminal;

at least one of the third voltage signal, the fourth voltage signal and the fifth voltage signal is different from the first voltage signal and the second voltage signal, wherein the output node control circuit includes a second node control sub-circuit, a third node control sub-circuit, a first output node control sub-circuit and a second output node control sub-circuit;

the second node control sub-circuit is electrically coupled to the first clock signal line, the third voltage line, the first output node, and a second node, respectively; the second node control sub-circuit is configured to, write the third voltage signal into the second node under control of the first clock signal, and write the first clock signal into the second node under control of the potential of the first output node;

the third node control sub-circuit is electrically coupled to a third node, the second node, and the second clock signal line, respectively; the third node control sub-circuit is configured to, write the second clock signal into the third node under control of a potential of the second node, and adjust a potential of the third node according to the potential of the second node;

the second output node control sub-circuit is electrically coupled to the second clock signal line, the third node, the second output node, the fourth voltage line, and the first output node, respectively; the second output node control sub-circuit is configured to control communication between the third node and the second output node under control of the second clock signal, write the fourth voltage signal provided by the fourth voltage line into the second output node under control of the potential of the first output node, and maintain the potential of the second output node;

the first output node control sub-circuit is electrically coupled to the first clock signal line, the input terminal, the second clock signal line, the fifth voltage line, the second node, and the first output node, respectively; the first output node control sub-circuit is configured to write the input signal provided by the input terminal into the first output node under control of the first clock signal, and write the fifth voltage signal into the first output node under control of the second clock signal and the potential of the second node.

2. The shift register unit according to claim 1, wherein the fourth voltage line and the fifth voltage line are a first high voltage line; the third voltage line is a second low voltage line; the first voltage line is the first high voltage line; the second voltage line is a first low voltage line; and a first low voltage signal provided by the first low voltage line is different from a second low voltage signal provided by the second low voltage line.

3. The shift register unit according to claim 1, wherein the third voltage line is a first low voltage line; the fourth voltage line and the fifth voltage line are a first high voltage line; the first voltage line is a second high voltage line; the second voltage line is the first low voltage line; and a first high voltage signal provided by the first high voltage line is different from a second high voltage signal provided by the second high voltage line.

4. The shift register unit according to claim 1, wherein the third voltage line is a first low voltage line; the fourth voltage line is a first high voltage line; the fifth voltage line is a second high voltage line; the first voltage line is the first high voltage line; the second voltage line is the first low voltage line; and a first high voltage signal provided by the first high voltage line is different from a second high voltage signal provided by the second high voltage line.

5. The shift register unit according to claim 1, wherein the third voltage line is a first low voltage line; the fourth voltage line is a second high voltage line; the fifth voltage line is a first high voltage line; the first voltage line is the first high voltage line; the second voltage line is the first low voltage line; and a first high voltage signal provided by the first high voltage line is different from a second high voltage signal provided by the second high voltage line.

6. The shift register unit according to claim 1, wherein the third voltage line is a first low voltage line; the fourth voltage line and the fifth voltage line are a first high voltage line; the first voltage line is a second high voltage line; the second voltage line is a second low voltage line;

a first low voltage signal provided by the first low voltage line is different from a second low voltage signal provided by the second low voltage line; and a first high voltage signal provided by the first high voltage line is different from a second low voltage signal provided by the second low voltage line.

7. The shift register unit according to claim 1, wherein the shift register unit further includes a first isolation circuit;

the first isolation circuit is electrically coupled to a first control voltage line, the first output node, and a first isolation node, respectively; the first isolation circuit is configured to, under control of a first control voltage provided by the first control voltage line, control communication between the first output node and the first isolation node;

the first output node is electrically coupled to the output circuit; and the first isolation node is electrically coupled to the first output node control sub-circuit.

8. The shift register unit according to claim 1, wherein the shift register unit further includes a second isolation circuit;

the second isolation circuit is electrically coupled to a second control voltage line, the second node, and a second isolation node, respectively; the second isolation circuit is configured to, under control of a second control voltage provided by the second control voltage line, control communication between the second node and the second isolation node;

the second node is electrically coupled to the second node control sub-circuit; and the second isolation node is electrically coupled to the third node control sub-circuit.

9. The shift register unit according to claim 1, wherein the second node control sub-circuit includes a first transistor and a second transistor;
- a control electrode of the first transistor is electrically coupled to the first clock signal line; a first electrode of the first transistor is electrically coupled to the third voltage line; a second electrode of the first transistor is electrically coupled to the second node;
- a control electrode of the second transistor is electrically coupled to the first output node; a first electrode of the second transistor is electrically coupled to the first clock signal line; a second electrode of the second transistor is electrically coupled to the second node;
- the third node control sub-circuit includes a sixth transistor and a second capacitor;
- a control electrode of the sixth transistor is electrically coupled to the second node; a first electrode of the sixth transistor is electrically coupled to the second clock signal line; a second electrode of the sixth transistor is electrically coupled to the third node;
- a first plate of the second capacitor is electrically coupled to the second node; a second plate of the second capacitor is electrically coupled to the third node;
- the second output node control sub-circuit includes a seventh transistor, an eighth transistor and a third capacitor;
- a control electrode of the seventh transistor is electrically coupled to the second clock signal line; a first electrode of the seventh transistor is electrically coupled to the third node; a second electrode of the seventh transistor is electrically coupled to the second output node;
- a control electrode of the eighth transistor is electrically coupled to the first output node; a first electrode of the eighth transistor is electrically coupled to the fourth voltage line; a second electrode of the eighth transistor is electrically coupled to the second output node;
- a first plate of the third capacitor is electrically coupled to the second output node; and a second plate of the third capacitor is electrically coupled to the first voltage line.

10. The shift register unit according to claim 1, wherein the first output node control sub-circuit includes a third transistor, a fourth transistor, a fifth transistor and a first capacitor;
- a control electrode of the third transistor is electrically coupled to the first clock signal line; a first electrode of the third transistor is electrically coupled to the input terminal; a second electrode of the third transistor is electrically coupled to the first output node;
- a control electrode of the fourth transistor is electrically coupled to the second clock signal line; a second electrode of the fourth transistor is electrically coupled to the first output node;
- a control electrode of the fifth transistor is electrically coupled to the second node; a first electrode of the fifth transistor is electrically coupled to the fifth voltage line; a second electrode of the fifth transistor is electrically coupled to a first electrode of the fourth transistor;
- a first plate of the first capacitor is electrically coupled to the first output node; and a second plate of the first capacitor is electrically coupled to the second clock signal line.

11. The shift register unit according to claim 10, wherein the shift register unit further includes a first isolation transistor and a second isolation transistor;
- a control electrode of the first isolation transistor is electrically coupled to the first control voltage line; a first electrode of the first isolation transistor is electrically coupled to the first isolation node; a second electrode of the first isolation transistor is electrically coupled to the first output node; the first output node is directly electrically coupled to the output circuit;
- a control electrode of the second isolation transistor is electrically coupled to the second control voltage line; a first electrode of the second isolation transistor is electrically coupled to the second node; a second electrode of the second isolation transistor is electrically coupled to the second isolation node;
- the second electrode of the third transistor is electrically coupled to the first output node through the first isolation transistor; the second electrode of the third transistor is directly electrically coupled to the first isolation node;
- the second node is directly electrically coupled to the second node control sub-circuit; and the second isolation node is directly electrically coupled to the third node control sub-circuit.

12. The shift register unit according to claim 11, wherein the second node control sub-circuit includes a first transistor and a second transistor;
- a control electrode of the first transistor is electrically coupled to the first clock signal line; a first electrode of the first transistor is electrically coupled to the third voltage line; a second electrode of the first transistor is electrically coupled to the second node;
- a control electrode of the second transistor is electrically coupled to the first isolation node; a first electrode of the second transistor is electrically coupled to the first clock signal line; a second electrode of the second transistor is electrically coupled to the second node;
- the third node control sub-circuit includes a sixth transistor and a second capacitor;
- a control electrode of the sixth transistor is electrically coupled to the second isolation node; a first electrode of the sixth transistor is electrically coupled to the second clock signal line; a second electrode of the sixth transistor is electrically coupled to the third node;
- a first plate of the second capacitor is electrically coupled to the second isolation node; a second plate of the second capacitor is electrically coupled to the third node;
- the second output node control sub-circuit includes a seventh transistor, an eighth transistor and a third capacitor;
- a control electrode of the seventh transistor is electrically coupled to the second clock signal line; a first electrode of the seventh transistor is electrically coupled to the third node; a second electrode of the seventh transistor is electrically coupled to the second output node;
- a control electrode of the eighth transistor is electrically coupled to the first isolation node; a first electrode of the eighth transistor is electrically coupled to the fourth voltage line; and a second electrode of the eighth transistor is electrically coupled to the second output node;
- a first plate of the third capacitor is electrically coupled to the second output node; and a second plate of the third capacitor is electrically coupled to the first voltage line.

13. The shift register unit according to claim 1, wherein the first output node control sub-circuit includes a third transistor, a fourth transistor, a fifth transistor and a first capacitor;
- a control electrode of the third transistor is electrically coupled to the first clock signal line; a first electrode of the third transistor is electrically coupled to the input terminal; a second electrode of the third transistor is electrically coupled to the first output node;
- a control electrode of the fourth transistor is electrically coupled to the first output node; a second electrode of the fourth transistor is electrically coupled to the second clock signal line;
- a control electrode of the fifth transistor is electrically coupled to the second node; a first electrode of the fifth transistor is electrically coupled to the fifth voltage line; a second electrode of the fifth transistor is electrically coupled to a first electrode of the fourth transistor;
- a first plate of the first capacitor is electrically coupled to the first output node; and a second plate of the first capacitor is electrically coupled to the first electrode of the fourth transistor.

14. The shift register unit according to claim 1, wherein the output circuit includes a ninth transistor and a tenth transistor;
- a control electrode of the ninth transistor is electrically coupled to the second output node; a first electrode of the ninth transistor is electrically coupled to the first voltage line; a second electrode of the ninth transistor is electrically coupled to the output terminal;
- a control electrode of the tenth transistor is electrically coupled to the first output node; a first electrode of the tenth transistor is electrically coupled to the output terminal; and a second electrode of the tenth transistor is electrically coupled to the second voltage line.

15. A scanning driving circuit, comprising:
multiple stages of shift register units;
wherein the shift register unit includes: an output terminal, an output circuit, and an output node control circuit;
wherein the output circuit is electrically coupled to a first output node, a second output node, a first voltage line, a second voltage line, and the output terminal, respectively; the output circuit is configured to, write a second voltage signal provided by the second voltage line into the output terminal under control of a potential of the first output node, and write a first voltage signal provided by the first voltage line into the output terminal under control of a potential of the second output node;
the output node control circuit is electrically coupled to the first output node, the second output node, a third voltage line, a fourth voltage line, a fifth voltage line, a first clock signal line, a second clock signal line, and an input terminal, respectively; the output node control circuit is configured to control the potential of the first output node and the potential of the second output node, according to a third voltage signal provided by the third voltage line, a fourth voltage signal provided by the fourth voltage line, a fifth voltage signal provided by the fifth voltage line, a first clock signal provided by the first clock signal line, a second clock signal provided by the second clock signal line and an input signal provided by the input terminal;
at least one of the third voltage signal, the fourth voltage signal and the fifth voltage signal is different from the first voltage signal and the second voltage signal, wherein the output node control circuit includes a second node control sub-circuit, a third node control sub-circuit, a first output node control sub-circuit and a second output node control sub-circuit;
the second node control sub-circuit is electrically coupled to the first clock signal line, the third voltage line, the first output node, and a second node, respectively; the second node control sub-circuit is configured to, write the third voltage signal into the second node under control of the first clock signal, and write the first clock signal into the second node under control of the potential of the first output node;
the third node control sub-circuit is electrically coupled to a third node, the second node, and the second clock signal line, respectively; the third node control sub-circuit is configured to, write the second clock signal into the third node under control of a potential of the second node, and adjust a potential of the third node according to the potential of the second node;
the second output node control sub-circuit is electrically coupled to the second clock signal line, the third node, the second output node, the fourth voltage line, and the first output node, respectively; the second output node control sub-circuit is configured to control communication between the third node and the second output node under control of the second clock signal, write the fourth voltage signal provided by the fourth voltage line into the second output node under control of the potential of the first output node, and maintain the potential of the second output node;
the first output node control sub-circuit is electrically coupled to the first clock signal line, the input terminal, the second clock signal line, the fifth voltage line, the second node, and the first output node, respectively; the first output node control sub-circuit is configured to write the input signal provided by the input terminal into the first output node under control of the first clock signal, and write the fifth voltage signal into the first output node under control of the second clock signal and the potential of the second node.

16. A display substrate, comprising:
a base substrate, a scanning driving circuit and a display area on the base substrate;
wherein the scanning driving circuit includes a plurality of shift register units according to claim 1; the scanning driving circuit further includes a first voltage line, a second voltage line, a third voltage line, a fourth voltage line, a fifth voltage line, a first clock signal line, and a second clock signal line; each of the first voltage line, the second voltage line, the third voltage line, the fourth voltage line, the fifth voltage line, the first clock signal line, and the second clock signal line extends along a first direction;
there is at least one driving transistor in the display area; and the driving transistor is configured to drive a light-emitting element for display.

17. The display substrate according to claim 16, wherein the first voltage line, the fourth voltage line and the fifth voltage line are a first high voltage line; the second voltage line is a first low voltage line; the third voltage line is a second low voltage line;
the second low voltage line is located at one side of the first low voltage line away from the display area; the first high voltage line is located between the first low voltage line and the second low voltage line; an orthographic projection of the first high voltage line onto the base substrate at least partially overlaps an orthographic projection of the shift register unit onto the base substrate;

the first clock signal line and the second clock signal line are arranged at one side of the second low voltage line away from the display area;

the shift register unit is located between the first clock signal line and the first low voltage line;

the output circuit in the shift register unit is located between the first low voltage line and the first high voltage line.

18. The display substrate according to claim 16, wherein the first voltage line is a second high voltage line; the second voltage line is a second low voltage line; the third voltage line is a first low voltage line; and the fourth voltage line and the fifth voltage lines are a first high voltage line;

the first low voltage line is located at one side of the second low voltage line away from the display area; and the first high voltage line and the second high voltage line are located between the first low voltage line and the second low voltage line;

an orthographic projection of the first high voltage line onto the base substrate at least partially overlaps an orthographic projection of the shift register unit onto the base substrate; and an orthographic projection of the second high voltage line onto the base substrate at least partially overlaps the orthographic projection of the shift register unit onto the base substrate;

the first high voltage line is located at one side of the second high voltage line away from the second low voltage line;

the output circuit in the shift register unit is located between the second low voltage line and the second high voltage line;

the first clock signal line and the second clock signal line are arranged at one side of the first low voltage line away from the display area; and the shift register unit is located between the first clock signal line and the second low voltage line.

19. A display device, comprising: the scanning driving circuit according to claim 15.

* * * * *